(12) United States Patent
Oh et al.

(10) Patent No.: US 12,244,130 B2
(45) Date of Patent: Mar. 4, 2025

(54) MOUNTING BRACKET WITH BENDABLE TABS FOR ELECTRICAL BOXES

(71) Applicant: ERICO International Corporation, Solon, OH (US)

(72) Inventors: Michael Hung-Sun Oh, Twinsburg, OH (US); James Anthony Bukowski, Akron, OH (US)

(73) Assignee: ERICO International Corporation, Solon, OH (US)

( * ) Notice: Subject to any disclaimer, the term of this patent is extended or adjusted under 35 U.S.C. 154(b) by 173 days.

(21) Appl. No.: 17/591,411

(22) Filed: Feb. 2, 2022

(65) Prior Publication Data
US 2022/0271521 A1 Aug. 25, 2022

Related U.S. Application Data

(60) Provisional application No. 63/151,426, filed on Feb. 19, 2021.

(51) Int. Cl.
| | |
|---|---|
| *H02G 3/12* | (2006.01) |
| *H02G 3/08* | (2006.01) |
| *H02G 3/14* | (2006.01) |
| *H02G 3/22* | (2006.01) |
| *H05K 5/02* | (2006.01) |

(52) U.S. Cl.
CPC ............ *H02G 3/126* (2013.01); *H02G 3/081* (2013.01); *H02G 3/086* (2013.01); *H02G 3/14* (2013.01); *H02G 3/22* (2013.01); *H05K 5/0204* (2013.01); *H05K 5/0217* (2013.01)

(58) Field of Classification Search
CPC ........ H02G 3/126; H02G 3/081; H02G 3/086; H02G 3/14; H02G 3/22; H05K 5/0204; H05K 5/0217; F16M 13/022
See application file for complete search history.

(56) References Cited

U.S. PATENT DOCUMENTS

| | | |
|---|---|---|
| 4,533,060 A | 8/1985 | Medlin |
| 4,572,391 A | 2/1986 | Medlin |
| 4,603,789 A | 8/1986 | Medlin, Sr. |
| 5,176,345 A | 1/1993 | Medlin |
| 5,263,676 A | 11/1993 | Medlin, Jr. et al. |

(Continued)

FOREIGN PATENT DOCUMENTS

| | | | |
|---|---|---|---|
| CA | 2577641 A1 * | 8/2007 | ............ H02G 3/123 |
| WO | 2009/015041 A2 | 1/2009 | |
| WO | 2010/008778 A2 | 1/2010 | |

*Primary Examiner* — Tan Le
(74) *Attorney, Agent, or Firm* — Quarles & Brady LLP

(57) ABSTRACT

A mounting bracket for electrical boxes that can include a mounting body with a central opening, a front face, a first and second set of keyhole features, a first bendable tab located adjacent a first side of the central opening, and a second bendable tab located adjacent a second side of the central opening. The first bendable tab can be bendable rearward away from the front face of the mounting body to engage an exterior surface of a side wall of the first electrical box and thereby secure the first fasteners within the first set of keyhole features. The second bendable tab can be bendable rearward away from the front face of the mounting body to engage an interior surface of a side wall of the second electrical box and thereby secure the second fasteners within the second set of keyhole features.

20 Claims, 23 Drawing Sheets

(56) References Cited

U.S. PATENT DOCUMENTS

| | | |
|---|---|---|
| 5,595,362 A | 1/1997 | Rinderer et al. |
| 6,227,499 B1 | 5/2001 | Jennison et al. |
| 6,871,827 B2 | 3/2005 | Petak et al. |
| 7,053,300 B2 | 5/2006 | Denier et al. |
| 7,439,443 B2 | 10/2008 | Dinh |
| 7,659,477 B2 | 2/2010 | Korcz et al. |
| D612,226 S | 3/2010 | Dinh |
| 7,798,458 B2 | 9/2010 | Borbolla et al. |
| 7,902,457 B2 | 3/2011 | Johnson |
| 7,923,635 B2 | 4/2011 | Korcz |
| 8,042,776 B2 | 10/2011 | Johnson |
| 8,403,289 B1 | 3/2013 | Rinderer |
| 8,575,484 B1 | 11/2013 | Witherbee |
| 8,658,894 B1 | 2/2014 | Witherbee |
| 9,444,236 B2 | 9/2016 | Witherbee |
| 9,559,504 B2 | 1/2017 | Jones |
| 9,627,868 B2 | 4/2017 | Mominee et al. |
| 9,653,899 B2 | 5/2017 | Salian et al. |
| 9,780,545 B2 | 10/2017 | Witherbee |
| D803,665 S | 11/2017 | Vrame |
| 9,853,431 B2 | 12/2017 | Jones |
| D821,849 S | 7/2018 | Nikayin et al. |
| 10,077,866 B2 | 9/2018 | Witherbee |
| D841,434 S | 2/2019 | Vrame |
| D887,252 S | 6/2020 | Zhang et al. |
| 10,711,940 B2 | 7/2020 | Witherbee |
| 11,248,740 B2 | 2/2022 | Witherbee et al. |
| 2006/0005987 A1* | 1/2006 | Denier ............... H02G 3/18 174/58 |
| 2007/0194188 A1* | 8/2007 | Johnson ............ H02G 3/126 248/218.4 |
| 2008/0093099 A1 | 4/2008 | Webb |
| 2008/0251650 A1* | 10/2008 | Borbolla ........... H02G 3/086 174/58 |
| 2010/0025066 A1 | 2/2010 | de la Borbolla |
| 2010/0078532 A1 | 4/2010 | Whipple et al. |
| 2010/0176138 A1 | 7/2010 | Zacharevitz et al. |
| 2010/0270446 A1 | 10/2010 | Phillips |
| 2010/0282933 A1 | 11/2010 | Phillips |
| 2013/0312997 A1 | 11/2013 | Korte et al. |
| 2015/0318677 A1 | 11/2015 | Witherbee |
| 2015/0333493 A1 | 11/2015 | Jones |
| 2016/0099555 A1 | 4/2016 | Nikayin et al. |
| 2017/0054282 A1 | 2/2017 | Witherbee |
| 2017/0093141 A1 | 3/2017 | Jones |
| 2019/0376643 A1* | 12/2019 | Witherbee ........... H02G 3/10 |
| 2020/0240549 A1* | 7/2020 | Oh ..................... H02G 3/388 |

* cited by examiner

MOUNTING BRACKET WITH BENDABLE TABS FOR ELECTRICAL BOXES

CROSS-REFERENCE TO RELATED APPLICATIONS

This application claims priority under 35 U.S.C. 119 from U.S. Provisional Application No. 63/151,426, filed Feb. 19, 2021, entitled "Mounting Bracket with Bendable Tabs for Electrical Boxes," and is incorporated herein by reference in its entirety.

BACKGROUND

In many applications, it may be useful to support electrical boxes and other components. For example, according to some construction standards, electrical boxes may be required to be supported at particular heights above a floor or at particular distances from certain other structures or components.

SUMMARY

Some embodiments of the invention provide a mounting bracket for electrical boxes. The mounting bracket can include an integrally-formed mounting body. The mounting body can include a central opening sized for access to an interior of an electrical box; a plurality of keyhole features arranged around the central opening, including a first set of keyhole features oriented to selectively receive first fasteners along a first elongate direction to secure a first electrical box to the mounting bracket and a second set of keyhole features oriented to selectively receive second fasteners along a second elongate direction to secure a second electrical box to the mounting bracket; a first bendable tab located adjacent a first side of the central opening on a first side of the mounting body; and a second bendable tab located adjacent a second side of the central opening on a second side of the mounting body. The first bendable tab can be bendable rearward away from a front face of the mounting body to engage an exterior surface of a side wall of the first electrical box and thereby secure the first fasteners within the first set of keyhole features. The second bendable tab can be bendable rearward away from the front face of the mounting body to engage an interior surface of a side wall of the second electrical box and thereby secure the second fasteners within the second set of keyhole features.

Some embodiments of the invention provide a mounting bracket and electrical box assembly. The assembly can include an electrical box selected from a set of electrical boxes including a first electrical box with a first width, a second electrical box with a second width different from the first width, and a mounting bracket with a mounting body that is secured to the electrical box. The mounting body can include a first set of keyhole features arranged around a central opening of the mounting body and can be configured to slidably receive first fasteners to attach the first electrical box to the mounting bracket in a first sliding direction. A second set of keyhole features can be arranged around the central opening of the mounting body and can be configured to slidably receive second fasteners to attach the second electrical box to the mounting bracket in a second sliding direction. A first bendable tab can be located on a first side of the mounting body and a second bendable tab can be located on a second side of the mounting body. Each of the first and second bendable tabs can be bendable relative to a front face of the mounting body. The first bendable tab, if the electrical box is the first electrical box, can be bent rearward away from the front face to extend over, and engage with, an exterior side of a side wall of the first electrical box, to prevent movement of the first electrical box opposite the first sliding direction and thereby secure the first fasteners within the first set of keyhole features. The second bendable tab, if the electrical box is the second electrical box, can be bent rearward away from the front face to extend over, and engage with, an interior side of a side wall of the second electrical box, to prevent movement of the second electrical box opposite the second sliding direction and thereby secure the second fasteners within the second set of keyhole features.

Some embodiments can provide a method of installing an electrical box on a mounting bracket. The method can include inserting a plurality of fasteners that are engaged with the electrical box into a plurality of keyhole features in a mounting body of the mounting bracket; translating the fasteners into engaging portions of the plurality of keyhole features; and bending a bendable tab on the mounting body to engage an interior surface of a side wall of the electrical box to secure the fasteners within the engaging portions of the plurality of keyhole features.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
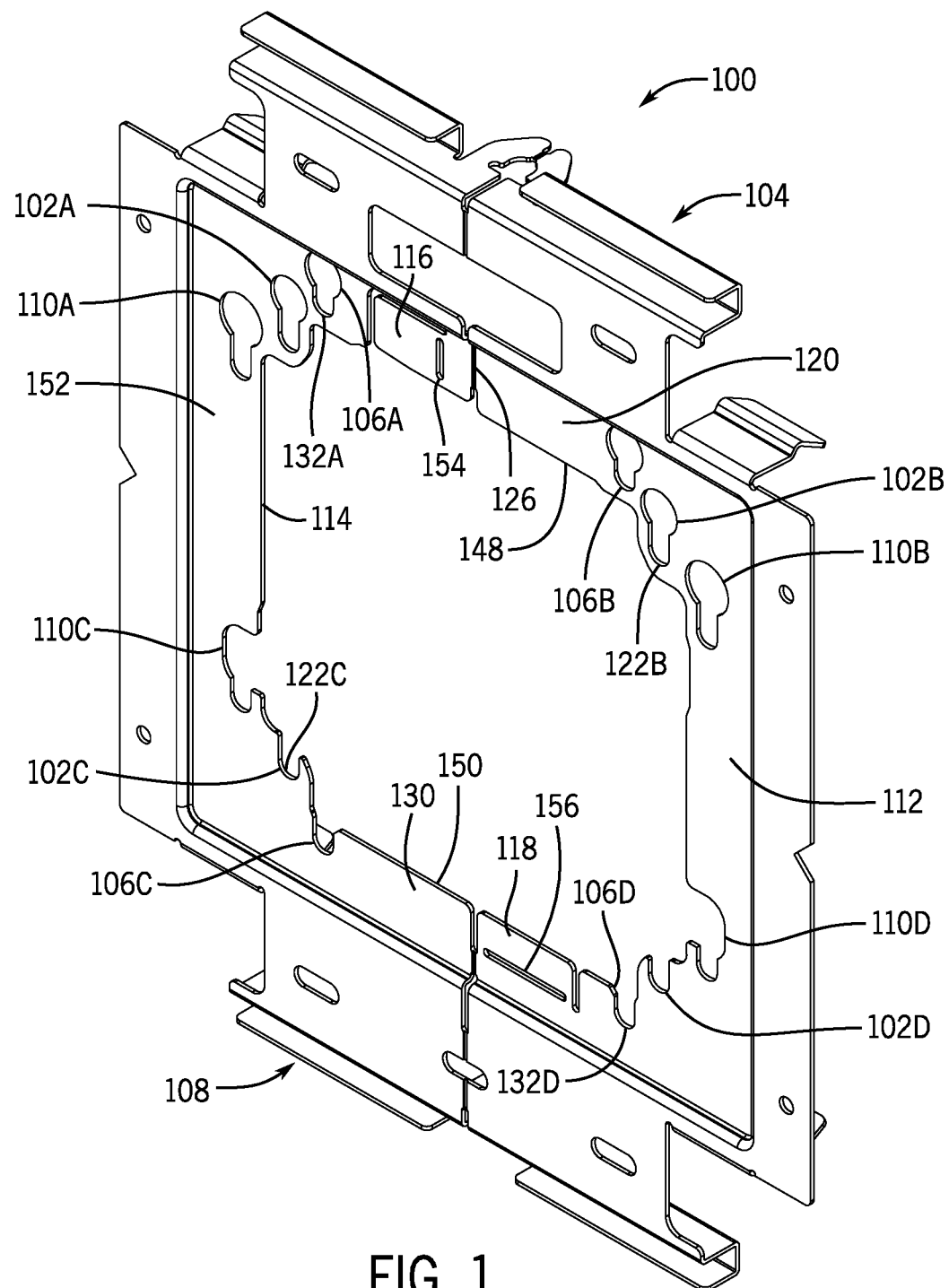
FIG. 1 is a front top right isometric view of a mounting bracket according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise specified or limited, directional terms are presented only with regard to the particular embodiment and perspective described. For example, reference to features or directions as "horizontal," "vertical," "front," "rear," "left," "right," "upper," "lower," "rearward," "forward," and so on are generally made with reference to a particular figure or example and are not necessarily indicative of an absolute orientation or direction. However, relative directional terms for a particular embodiment may generally apply to alternative orientations of that embodiment. For example, "front" and "rear" directions or features (or "right" and "left" directions or features, and so on) may be generally understood to indicate relatively opposite directions or features for a particular embodiment, regardless of the absolute orientation of the embodiment (or relative orientation relative to environmental structures). "Lateral" and derivatives thereof generally indicate directions that are generally perpendicular to a vertical direction for a relevant reference frame.

Also as used herein, ordinal numbers are used for convenience of presentation only and are generally presented in an order that corresponds to the order in which particular features are introduced in the relevant discussion. Accordingly, for example, a "first" feature may not necessarily have any required structural or sequential relationship to a "second" feature, and so on. Further, similar features may be referred to in different portions of the discussion by different ordinal numbers. For example, a particular feature may be referred to in some discussion as a "first" feature, while a similar or substantially identical feature may be referred to in other discussion as a "third" feature, and so on.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, in some contexts, it may be useful to support electrical boxes and other components relative to structures. Embodiments of the invention can be useful for this purpose, and others. For example, embodiments of the invention can be used to support one or more electrical boxes, mud rings, or other electrical components on a support at a configurable distance away from supporting structures, such as wall studs, or in other orientations. As another example, embodiments of the invention can include attachment devices configured to be manually engaged with corresponding rails on a support, for quick, tool-less connection of a mounting bracket to the support. Further, in some contexts, it may be useful to support an electrical box by a mounting bracket without needing a mud-ring also attached to the electrical box.

In some embodiments, a mounting bracket can include a first bendable tab that can bend to extend partially over a side wall of an electrical box that is attached to the mounting bracket. The bendable tab can prevent the electrical box from accidentally detaching from the mounting bracket, including by contacting the relevant side wall to secure associated fasteners of the electrical box within keyhole features of the mounting brackets.

In some embodiments, a mounting bracket can have multiple bendable tabs, each of the bendable tabs (or of a subset thereof) configured to engage with a different size of electrical box that can be attached to the mounting bracket. In some embodiments, the bendable tab can bend to extend over, and engage with, an exterior side of the electrical box. In some embodiments, the bendable tab can bend to extend over, and engage with, an interior side of the electrical box. In some embodiments, at least one bendable tab can bend to extend over an exterior side of a first electrical box and at least one other bendable tab can bend to extend over an interior side of a second electrical box, wherein the first and second electrical boxes are different sizes.

In some contexts, it may be useful to provide a mounting bracket that allows attachment of an electrical box in different orientations. In some embodiments, the mounting bracket can have multiple sets of keyhole features, each set configured to be alignable with the mounting holes of an electrical box. For electrical boxes that are not rotationally symmetrical with respect to their mounting holes, a second set of keyhole features can be provided on the mounting bracket configured to align with the mounting holes of the electrical box when the electrical box is rotated 90 degrees from a first orientation where the mounting holes align with a first set of keyhole features.

In some conventional arrangements, a mud-ring is needed to secure the attachment of an electrical box to a mounting bracket. The required installation of a mud-ring during the installation of the electrical box can be the cause of some irritation for an electrician because the mud-ring reduces the size of the access opening into the electrical box. This makes securing conduit to the electrical box and making wire splices within the electrical box more cumbersome.

Some embodiments of the invention can address this issue, or others. For example, some embodiments of the invention are presented below in the context of mounting brackets for electrical boxes, wherein the mounting brackets have bendable tabs that can cooperate with keyhole features to retain an electrical box on the mounting bracket without requiring a mud-ring. Generally, the principles disclosed herein can be used with any variety of mounting brackets, including stud-mounted brackets, floor-supported brackets, between-stud brackets, and so on, and can be used to secure any variety of components in place.

With regard to construction, each of the embodiments presented below can be readily formed as an integral stamping, with mechanical or other (e.g., welded, adhesive-based, etc.) attachment of other components, as needed. In other embodiments, however, other manufacturing techniques can be used, including extrusion, additive manufacturing, casting, and so on.

Figure 2:
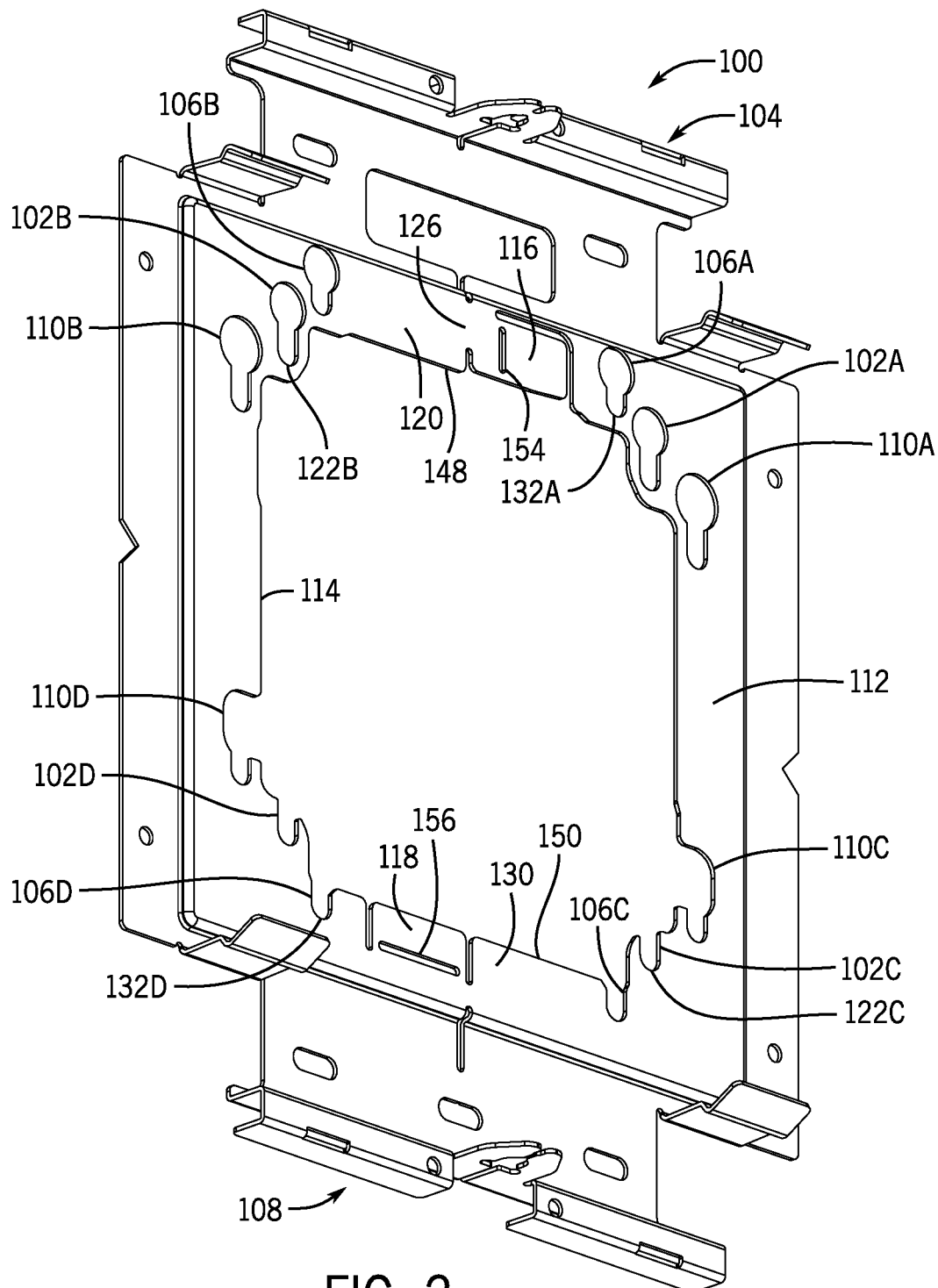
FIG. 2 is a rear bottom right isometric view of the mounting bracket of FIG. 1.
Figure 3:
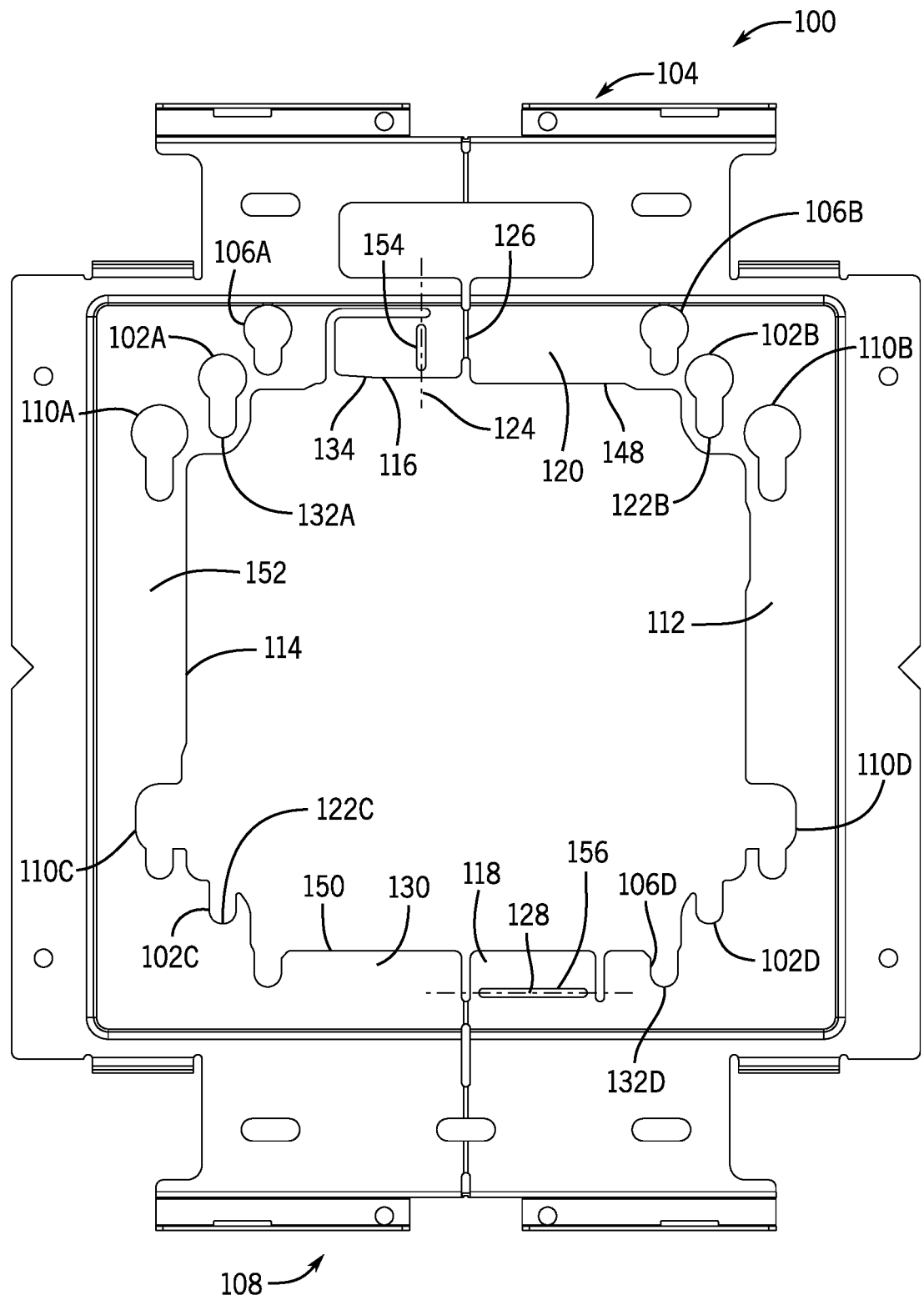
FIG. 3 is a front elevation view of the mounting bracket of FIG. 1.
Figure 4:
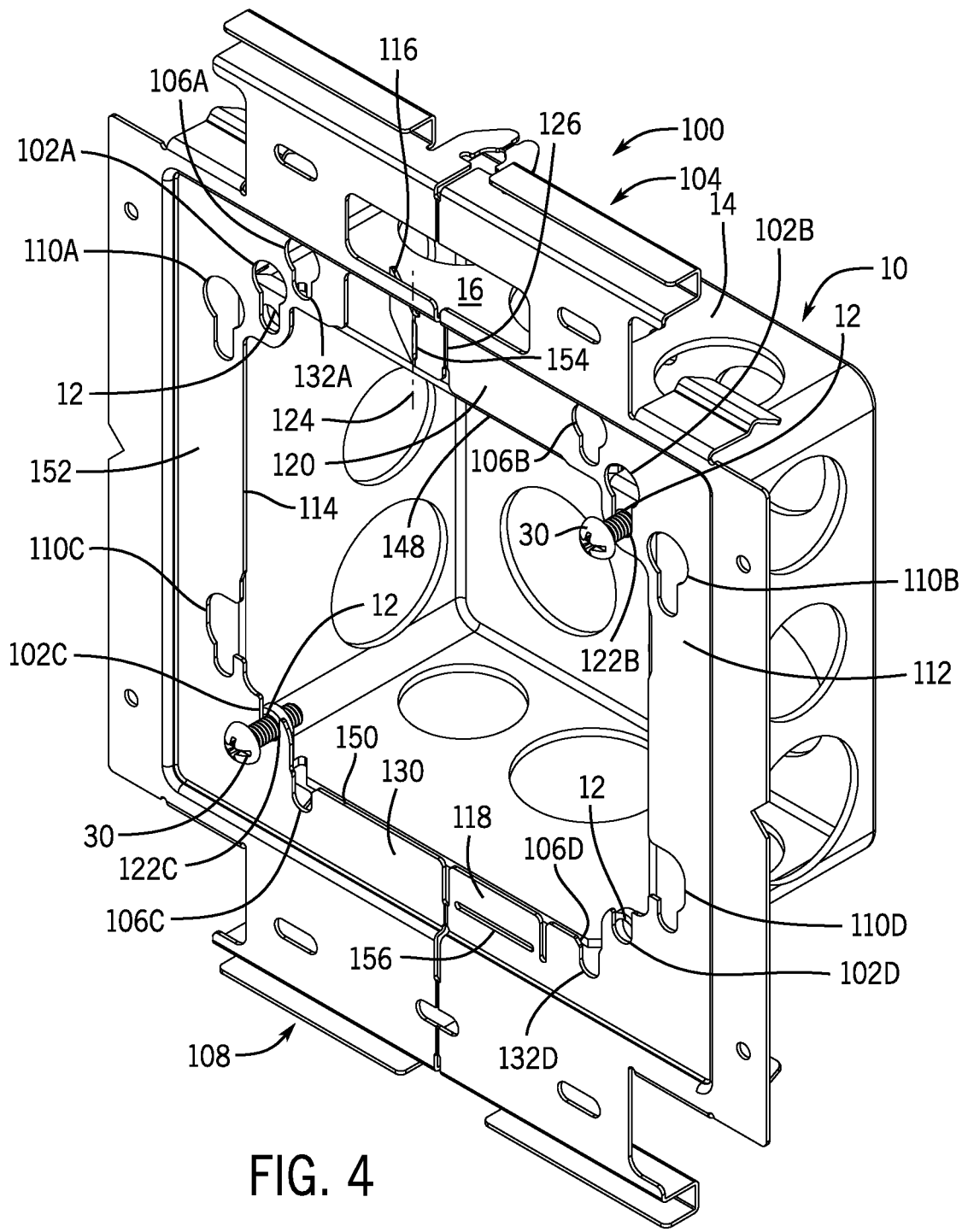
FIG. 4 is a front top right isometric view of the mounting bracket of FIG. 1 attached to a first electrical box according to an embodiment of the invention.
Figure 5:
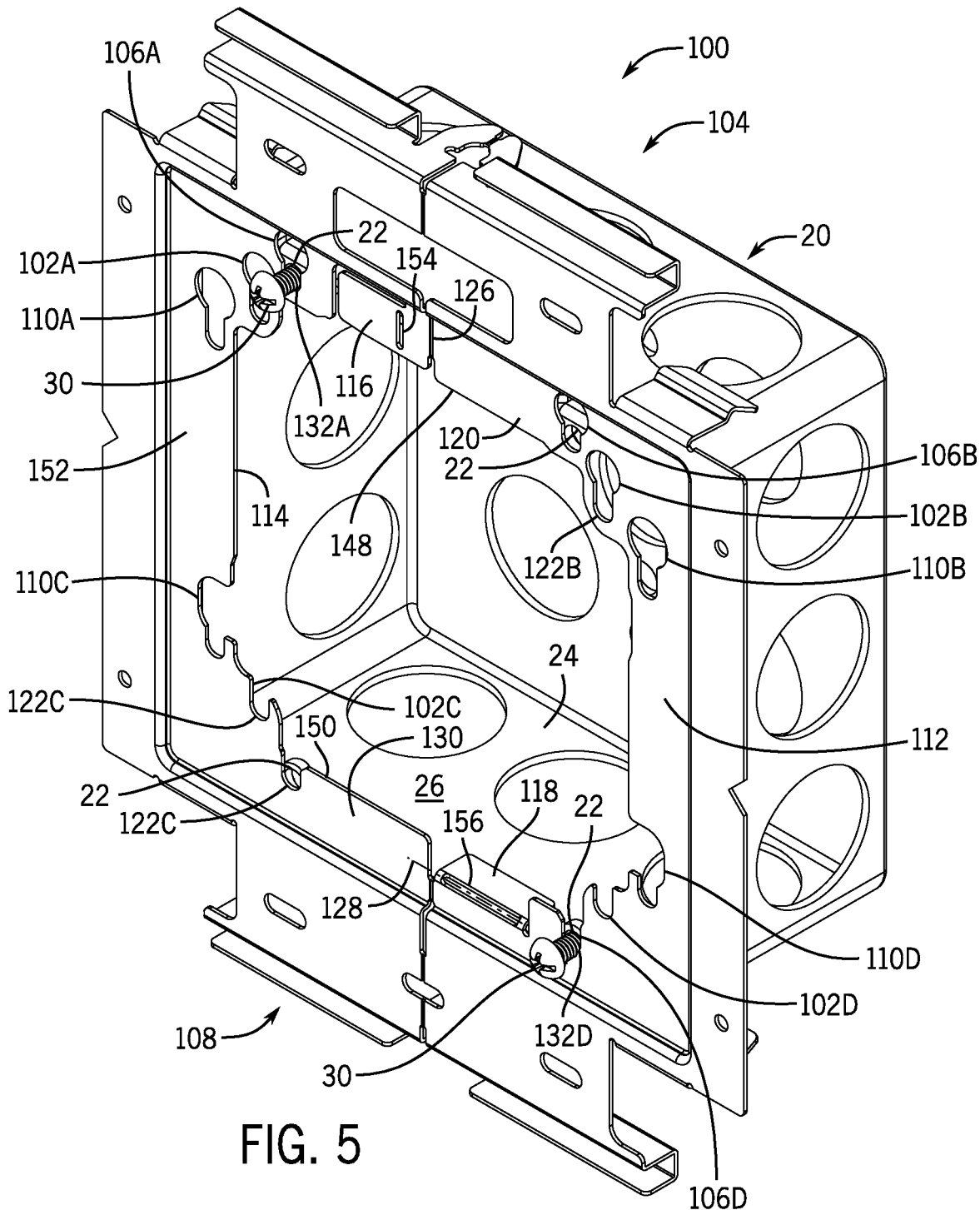
FIG. 5 is a front top right isometric view of the mounting bracket of FIG. 1 attached to a second electrical box according to an embodiment of the invention.

FIGS. 1 through 3 illustrate an embodiment of a mounting bracket 100 configured for mounting an electrical box thereto (e.g., as shown in FIGS. 4 and 5). As illustrated, the mounting bracket 100 is formed as a stamping from a single blank of material (e.g., 23 gauge mild steel), although a variety of other approaches are possible. In the illustrated embodiment, the mounting bracket 100 includes a first attachment device 104 and a second attachment device 108 connected to opposite sides of a mounting body 112. Each of the first and second attachment devices 104, 108 is configured to engage one of first and second rails (not shown) of a bracket support (not shown) that can extend horizontally between wall support members (not shown). Although the illustrated configuration of the attachment devices 104, 108 may be particularly useful, a variety of other arrangements are possible, including any variety of known approaches to secure (e.g., a first means of support, a floor stand, etc.).

The mounting body 112 contains features for the attachment of an electrical box to the mounting bracket 100. For example, the mounting body 112 includes a variety of keyhole features, including keyhole openings 102A, 102B, 106A, 106B, 110A, 110B and associated keyhole slots 102C, 102D, 106C, 106D, 110C, 110D that are located about a central opening 114 in the mounting body 112. With reference to the mounting bracket 100 and the orientation thereof as shown in FIGS. 1 and 3, the keyhole openings 102A, 106A, 110A are located in the upper left corner of the mounting body 112; the keyhole openings 102B, 106B, 110B are located in the upper right corner; the keyhole slots 102C, 106C, 110C are located in the lower left corner; and the keyhole slots 102D, 106D, 110D are located in the lower right corner. The keyhole openings 102A, 102B, 106A, 106B, 110A, 110B are separate, self-contained, features spaced from the central opening 114. The keyhole slots 102C, 102D, 106C, 106D, 110C, 110D are defined as extensions of the central opening 114. In some embodiments, the keyhole slots 102C, 102D, 106C, 106D, 110C, 110D can be configured similarly to the keyhole openings 102A, 102B, 106A, 106B, 110A, 110B (i.e., separate, self-contained, and spaced from the central opening 114).

Continuing, in the illustrated embodiment, the keyhole openings 102A, 102B, 106A, 106B, 110A, 110B extend in a parallel arrangement along the mounting body 112—i.e., exhibit parallel engaging directions for an associated fastener. Each keyhole opening of sets of corresponding keyholes 102A/102B, 106A/106B, 110A/110B is collaterally spaced from the other of the set. Similarly, the keyhole slots 102C, 102D, 106C, 106D, 110C, 110D extend in a parallel arrangement, with each keyhole slot of sets of corresponding keyhole slots 102C/102D, 106C/106D, 110C/110D collaterally spaced from the other of the set. Further, the keyhole openings 102A, 106A, 110A are aligned with the respective keyhole slots 102C, 106C, 110C, and keyhole openings 102B, 106B, 110B are aligned with the respective keyhole slots 102D, 106D, 110D.

As shown in FIGS. 4 and 5, the mounting bracket 100 is configured to be selectively attached to electrical boxes 10, 20 or different sizes (e.g., a 4-inch, a $4^{11}/_{16}$ inch, or a 5-inch electrical box). In particular, The keyhole openings 102A, 102B, 106A, 106B, 110A, 110B and the keyhole slots 102C, 102D, 106C, 106D, 110C, 110D are configured to selectively receive fasteners that extend from fastener holes on various sizes of electrical boxes and to receive fasteners (shown as screws 30) therethrough to attach the respective electrical box to the mounting bracket 100. For example, looking at FIG. 4, keyhole openings 102A, 102B and keyhole slots 102C, 102D form a first set of keyhole features (collectively referred to with number 102) that are spaced so as to align with mounting holes 12 of a 4-inch electrical box 10. The first set of keyhole features 102 can also be used with the electrical box 10 rotated 90, 180, or 270 degrees because the electrical box 10 is rotationally symmetrical with respect to the location of the mounting holes 12.

As another example, looking at FIG. 5, the keyhole openings 106A, 106B and keyhole slots 106C, 106D form a second set of keyhole features (collectively referred to with number 106) that are spaced so as to align with mounting holes 22 of a $4^{11}/_{16}$-inch electrical box 20. In some cases, if the electrical box 20 is rotated 90 degrees (not shown), the second set of keyhole openings 106 may not align with the mounting holes 22 because the electrical box 20 is not rotationally symmetrical. The keyhole openings 110A, 110B and the keyhole slots 110C, 110D, however, form a third set of keyhole features (collectively referred to with number 110) that are spaced so as to align with the mounting holes 22 of the electrical box 20. The second and third set of keyhole features 106, 110, respectively, therefore allow the electrical box 20 to be rotated 90, 180, and 270 degrees relative to the mounting bracket 110 from the orientation shown in FIG. 5. The ability to rotate the electrical box to a different orientation can be advantageous, for example, when the knock-out configurations on each side of the electrical box are different. In that case, a user may prefer one side of the electrical box to be in a certain location, which may necessitate rotating the electrical box to achieve such an orientation.

Additionally, or alternatively, keyhole features similar to the keyhole features 106, 110 can be arranged and spaced on an embodiment of the mounting bracket to align with the mounting holes of a 5-inch box. Similar to the $4^{11}/_{16}$-inch box, the mounting holes on a 5-inch box may not be rotationally symmetrical, therefore two sets of keyhole features can allow the 5-inch box to be mounted in four orientations. It is further contemplated that a mounting bracket according to the invention may include one set of mounting holes for mounting a 4 11/16-inch box in two orientations (rotated 180 degrees from each other) and another set of mounting holes for mounting a 5-inch box in two orientations (rotated 180 degrees from each other).

The mounting bracket 100 also includes features to retain the attachment of the electrical box to the mounting bracket 100. In FIGS. 1-5, the mounting bracket 100 is shown having a first bendable tab 116 and a second bendable tab 118. The first bendable tab 116 is located adjacent a first side 148 of the central opening 114 on a first side 120 of the mounting body 112. Looking at FIG. 4 in particular, the first bendable tab 116 is configured to be bent rearward away from a front face 152 of the mounting body 112 at a pre-formed bend feature (e.g., an elongate slot 154 or other feature, such as, for example, a pattern of slots or other perforation configured to aid in bending along a predetermined contour (e.g., line) by providing a weakened bending resistance along a predetermined region of body). In the illustrated embodiment, the slot 154 defines a first bend axis 124, which is parallel to the elongate directions of the first set of keyhole features 102 (i.e., an axis in parallel with the direction in which a fastener is moved, after being received in the wider portion of the keyhole feature, to be seated in an installed position in the narrower portion of the keyhole feature). After the electrical box 10 is attached to the mounting bracket 100 and the fasteners 30 are positioned in narrowed engaging portions 122B, 122C of keyhole opening 102B and keyhole slot 102C, respectively, the first bendable tab 116 can be bent about the first bend axis 124 to extend the first bendable tab 116 at least partially over the exterior side 16 of a top side wall 14 of the electrical box 10. Thus, the first bendable tab 116 is configured to prevent the electrical box 10 from detaching from the mounting bracket 100 by contacting the top side wall 14, to prevent the electrical box 10 from moving in a direction opposite an associated engaging direction (i.e., the direction that the fasteners 30 travel when entering and then terminating in the engaging portions 122B, 122C, extending away from the first side 120 of the mounting body 112, on which the first bending tab 116 is located). If it is desired to detach the electrical box 10 from the mounting bracket 100, a user may bend the first bendable tab 116 back toward the main plane of the mounting body 112, forward away from the position over the top side wall 14.

In some embodiments, a bendable tab can include features that can further assist in securing an electrical box to a mounting bracket. For example, the bendable tab 116 includes a tapered engagement surface 134 that faces toward the central opening 114, as shown in FIG. 3 in particular. The tapered engagement surface 134 is obliquely angled upward from an adjacent horizontal edge of the central opening 114, and obliquely relative to a vertical centerline of the bracket 100, so that an edge of a distal end of the bendable tab 116 is farther from an edge of the central opening 114 and the distal end in general is shorter than a the tab 116 at the first bend axis 124. The tapered engagement surface 134 can help to ensure appropriate engagement with the electrical box 10 as the bendable tab 116 is bent to secure the electrical box 10 despite potential variations between electrical boxes of the same nominal size. The tapered engagement surface 134 can also effectively act as a wedge, or cam, to urge the electrical box 10 into tighter engagement with the keyhole features 102 as the bendable tab 116 is bent further and further out of the front plane of the mounting body 112.

Although the first bendable tab 116 is shown in a position that is off-center on the first side 120 of the mounting body 112, it is contemplated that a bendable tab similar to the first bendable tab 116 may be positioned elsewhere along the first side 120. For example, see FIG. 6 in which a first bendable tab 216 is located in the center of a first side 220 of a mounting bracket 200. In the illustrated embodiment, however, the mounting bracket 100 has a break feature (e.g., a break line 126) that allows the mounting bracket 100 to be broken in half and, therefore, the first bendable tab 116 is shown located to one side of the break line 126. In some embodiments a bendable tab similar to the first bendable tab 116 could be located on the other side of the break line 126. In other embodiments, another bendable tab, similar to or different than the first bendable tab 116, could be provided on the other side of the break line 126 in addition to the first bendable tab 116. The additional bendable tab, for example, could be for retaining a different size electrical box (e.g., a 5-inch electrical box) or an electrical box of the same size. In some embodiments, a mounting bracket may not include a break feature and a bendable tab like the first bendable tab 116 can be located anywhere along the first side 120 of the mounting body 112, including being centered along the first side 120. Further, in embodiments of the mounting bracket without a break feature, more than one bendable tab for the same size electrical box or for different sizes could be provided along a first side thereof.

Looking at FIG. 5, in particular, the second bendable tab 118 is located adjacent a second side 150 of the central opening 114 on a second side 130 of the mounting body 112. The second bendable tab 118 is configured to be bent rearward away from the front face 152 of the mounting body 112 at a pre-formed bend feature (e.g., an elongate slot 156) a second bend axis 128, which is perpendicular to the elongate directions of the second and third sets of keyhole features 106, 110 and the first bend axis 124. The electrical box 20 is shown attached to the mounting bracket 100 with fasteners 30 using the keyhole opening 106A and the keyhole slot 106D. After the electrical box 20 is attached to the mounting bracket 100 and the fasteners 30 are positioned in narrowed engaging portions 132A, 132D of keyhole opening 106A and keyhole slot 106D, respectively, the second bendable tab 118 is bent about the second bend axis 128 to extend the second bendable tab 118 at least partially over the interior side 26 of a bottom side wall 24 of the electrical box 20. Thus, the second bendable tab 118 is configured to prevent the electrical box 20 from detaching from the mounting bracket 100 by contacting the bottom side wall 24, to prevent the electrical box 20 from moving in a direction opposite an associated engaging, fastener insertion, or sliding, direction (i.e., the direction that the fasteners 30 travel when entering and then terminating in the engaging portions 132A, 132D, extending toward the second side 130 of the mounting body 112 and away from the first side 120 of the mounting body 112). If it is desired to detach the electrical box 20 from the mounting bracket 100, a user may bend the second bendable tab 118 back toward the main plane of the mounting body 112, forward away from the position over the bottom side wall 24.

Although the second bendable tab 118 is shown in a position that is off-center on the second side 130 of the mounting body 112 on one side of the break line 126, similar to but diagonally opposite the first bendable tab 116, it is contemplated that a bendable tab similar to the second bendable tab 118 may be positioned elsewhere along the second side 130. For example, in some embodiments a bendable tab similar to the second bendable tab 118 can be located on the other side of the break line 126. In other embodiments, another bendable tab, similar to or different than the second bendable tab 118, could be provided on the other side of the break line 126 in addition to the second bendable tab 118. The additional bendable tab could be for retaining a different size electrical box (e.g., a 5-inch electrical box, for which mounting was described above). In some embodiments, a mounting bracket may not include a break feature and a bendable tab like the second bendable tab 118 can be located anywhere along the second side 130 of the mounting body 112, including being centered there along. Further, in embodiments of the mounting bracket without a break feature, more than one bendable tab for the same size electrical box or for different sizes could be provided along a second side thereof.

Continuing, in some embodiments, a bendable tab (e.g., a third bendable tab) can be provided on another side of a mounting bracket. For example, considering the mounting bracket 100, some embodiments can include a bendable tab along one of the sides of the center opening 114 that is adjacent to the first and second sides 120, 130. In such an arrangement, a further (or alternative) set of keyhole features (not shown) can be provided with a perpendicular alignment relative to the keyhole features 102, 106, 110, so that the tab can secure fasteners within the further (or alternative) set of keyhole features similarly to either of the tabs 116, 118. Thus, for example, as needed, a bendable tab can be configured to function similarly to the tabs 116, 118 but to secure an electrical box of any variety of sizes relative to an engaging direction that is perpendicular to the engaging directions associated with the tabs 116, 118.

Figure 6:
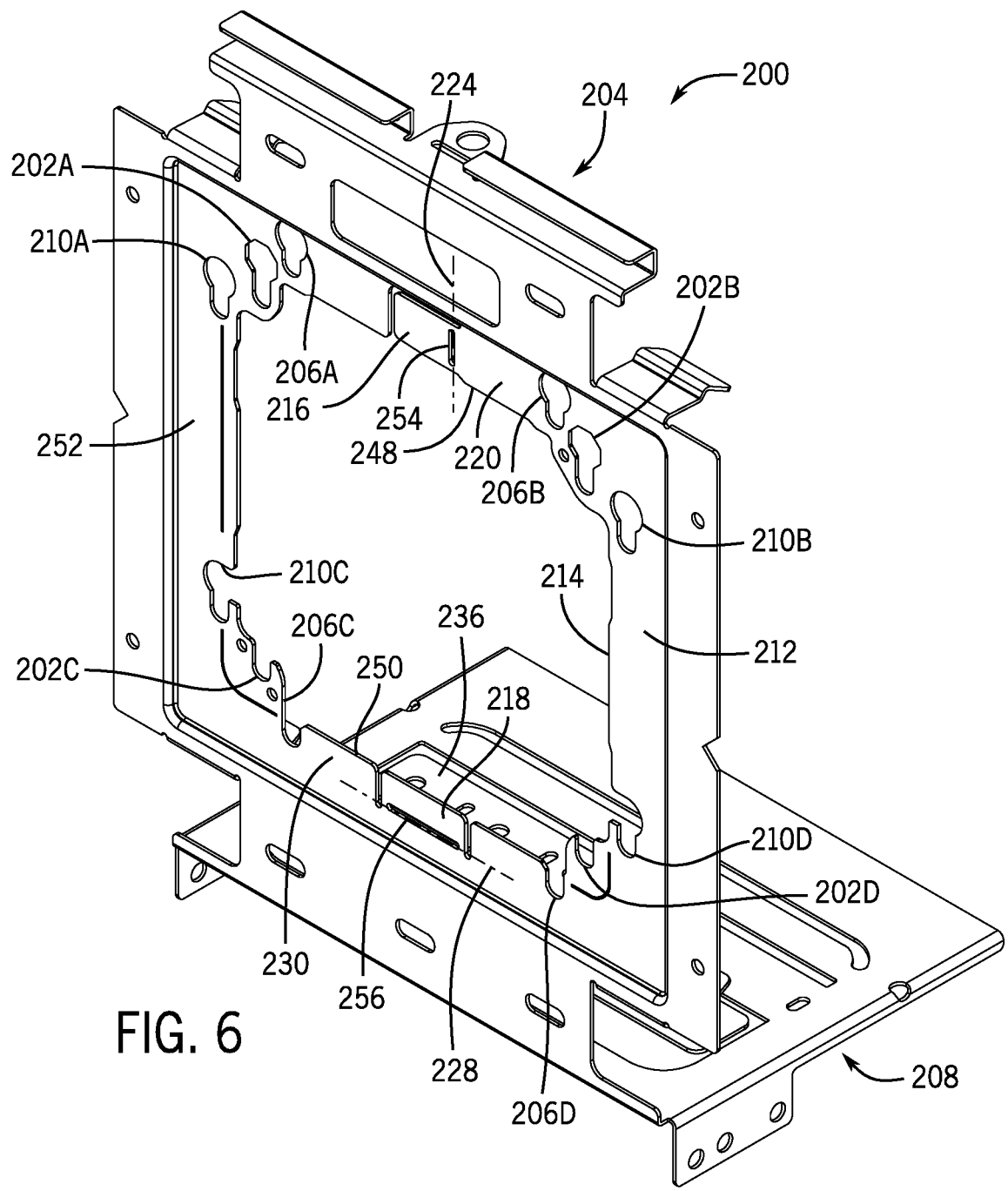
FIG. 6 is a front top right isometric view of a mounting bracket according to another embodiment of the invention.
Figure 7:
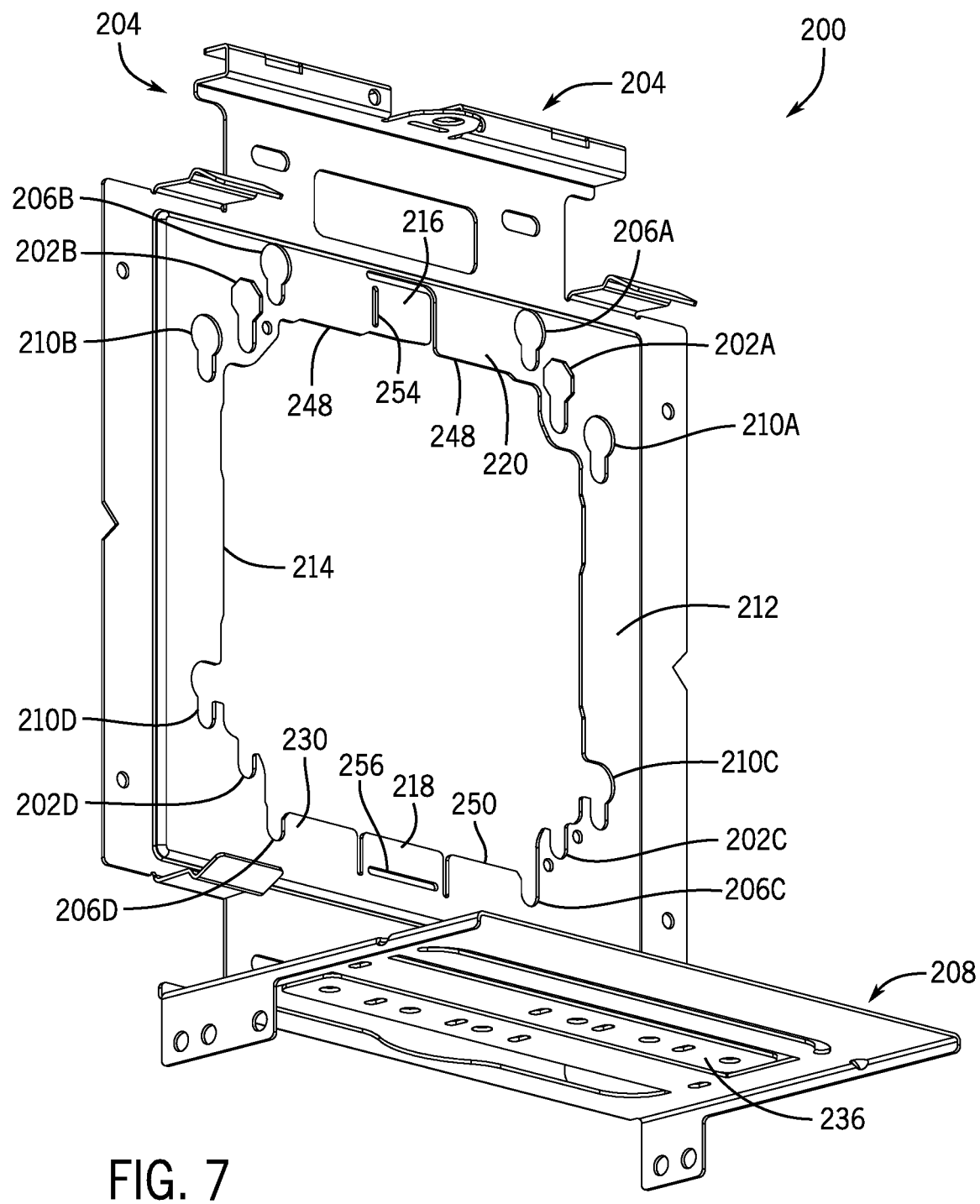
FIG. 7 is a rear bottom right isometric view of the mounting bracket of FIG. 6.

FIGS. 6 and 7 illustrate another embodiment of a mounting bracket 200 according to the invention, as also can be attached to an electrical box (for example, the electrical boxes 10, 20 shown in FIGS. 4 and 5, respectively). In many aspects, the mounting bracket 200 is similar to the mounting bracket 100 described above and similar numbering in the 200 series is used for the mounting bracket 200. For example, the mounting bracket 200 has a first attachment device 204 and a mounting body 212 with a plurality of keyhole features including a first set of keyhole features (collectively referred to with number 202), a second set of keyhole features (collectively referred to with number 206), a third set of keyhole features (collectively referred to with number 210), a first bendable tab 216 adjacent a first side 248 of a central opening 214 on a first side 220, and a second bendable tab 218 adjacent a second side 250 of the central opening 214 on a second side 230. The first bendable tab 216 is configured to be bent rearward away from a front face 252 of the mounting body 212 at a pre-formed bend feature (e.g., an elongate slot 254) that defines a first bend axis 224 (shown in FIG. 6), which is parallel to the elongate directions of the first set of keyhole features 202. Further, the second bendable tab 218 is configured to be bent rearward away from the front face 252 of the mounting body 212 at a pre-formed bend feature (e.g., an elongate slot 256) that defines a second bend axis 228 (shown in FIG. 6), which is perpendicular to the elongate directions of the second and third sets of keyhole features 206, 210 and the first bend axis 224. The mountable bracket 200 is also configured to be attachable to different size electrical boxes. For example, in some embodiments the mountable bracket 200 can be attachable to at least one of a 4-inch electrical box, a 4¹¹⁄₁₆-inch electrical box, or a 5-inch electrical box.

In some aspects, however, the brackets 100, 200 differ from each other. For example, the mounting bracket 200 has a far side support device 208 extending from the second side 230 that is configured to mount the mounting bracket 200 to a vertical wall support member (not shown). The far side support device 208 is configured to prevent the mounting bracket 200 from bending into the wall space by abutting a wall covering (not shown) attached to the opposite side of the wall to which the attachment device 204 is mounted. The far side support device 208 also includes bendable supports 236 configured to be bent toward and attached to the vertical wall support member with a fastener (not shown).

Figure 8:
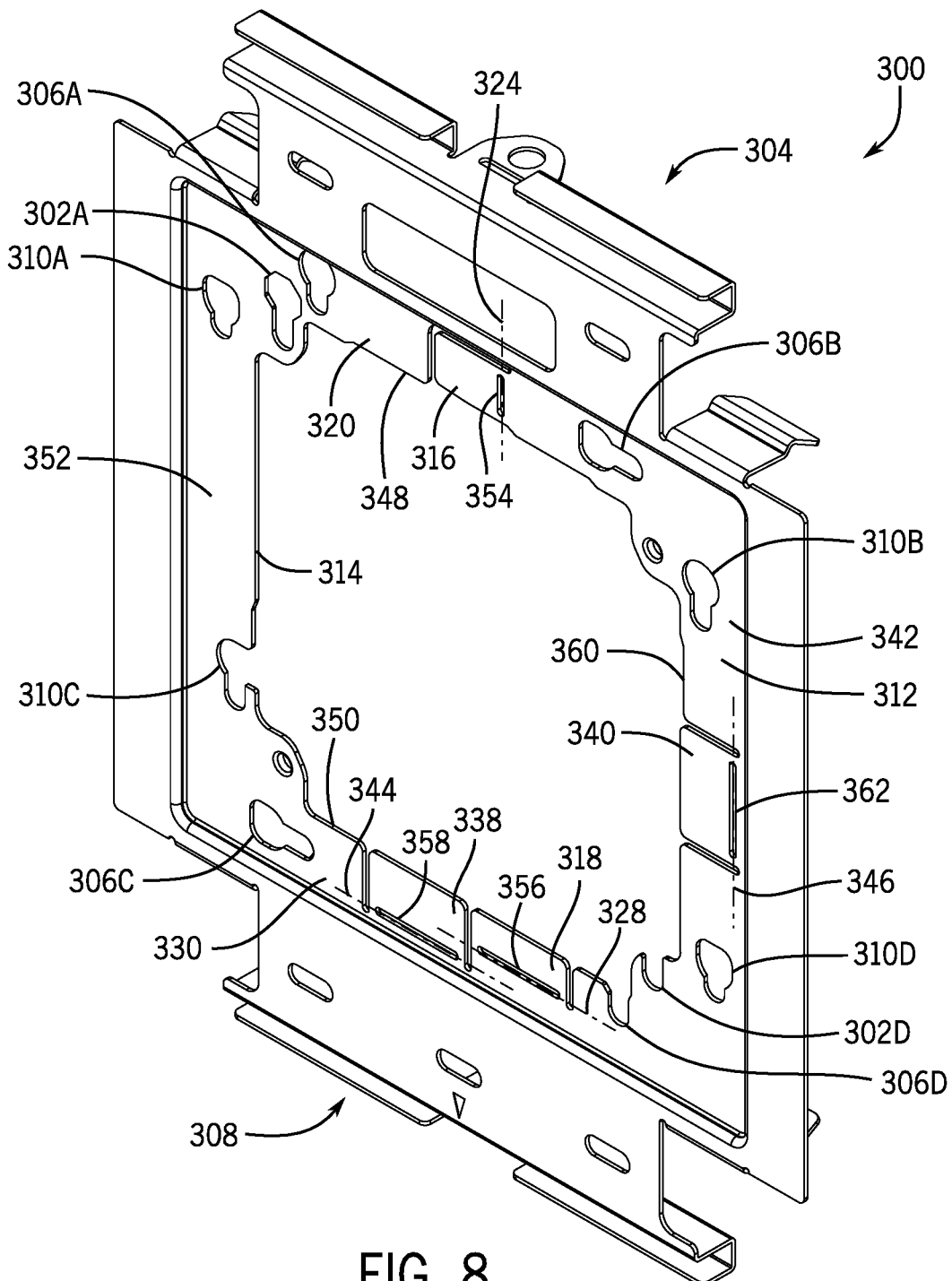
FIG. 8 is a front top right isometric view of a mounting bracket according to another embodiment of the invention.
Figure 9:
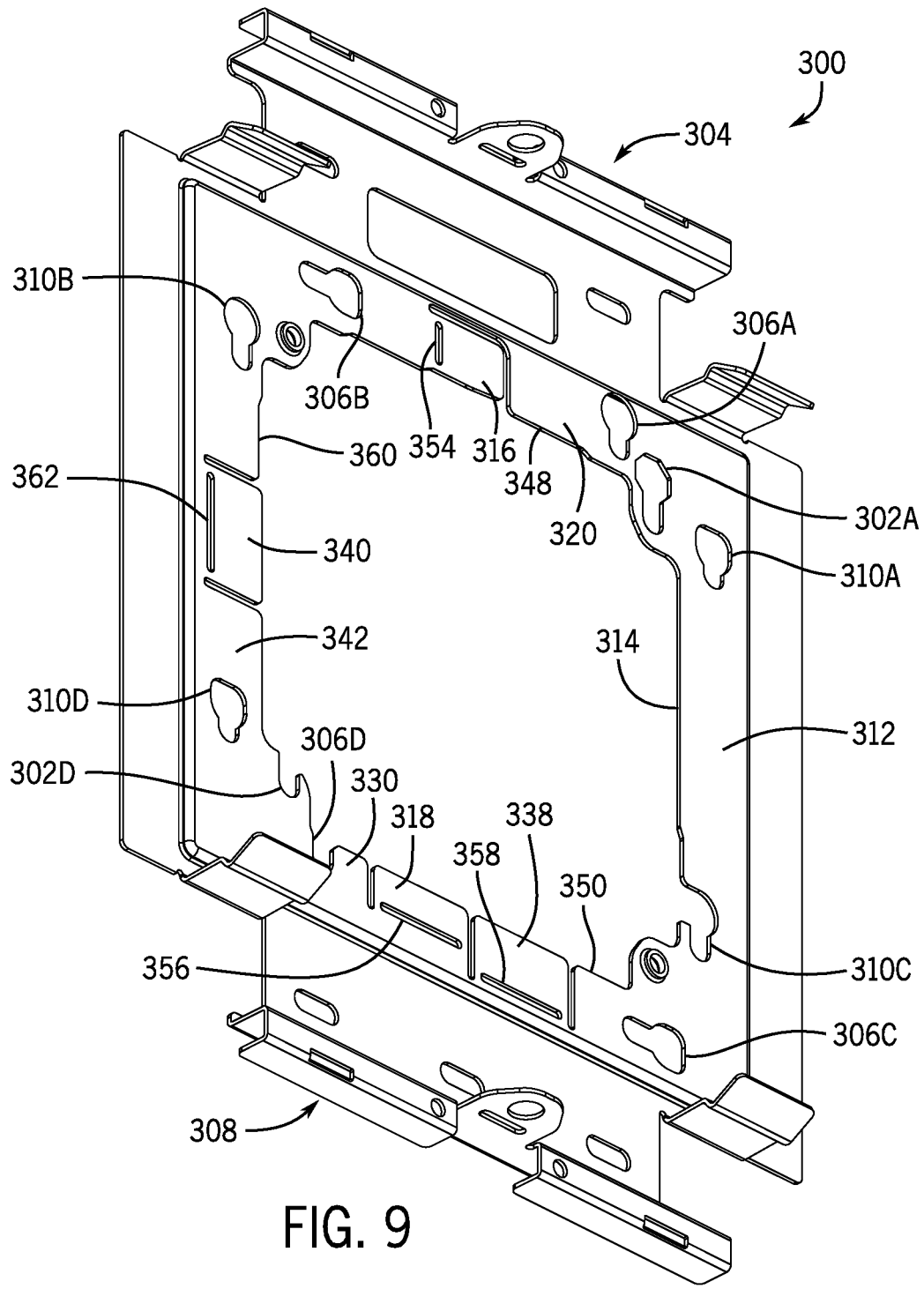
FIG. 9 is a rear bottom right isometric view of the mounting bracket of FIG. 8.

FIGS. 8 and 9 illustrate another embodiment of a mounting bracket 300 according to the invention, as also can be attached to an electrical box (for example, the electrical boxes 10, 20 shown in FIGS. 4 and 5, respectively). In many aspects, the mounting bracket 300 is similar to the mounting bracket 100 described above and similar numbering in the 300 series is used for the mounting bracket 300. For example, the mounting bracket 300 has a first attachment device 304, a second attachment device 308, and a mounting body 312 with front face 352, a plurality of keyhole features including a first set of keyhole features (collectively referred to with number 302), a second set of keyhole features (collectively referred to with number 306), a third set of keyhole features (collectively referred to with number 310), a first bendable tab 316 adjacent a first side 348 of a central opening 314 on a first side 320, and a second bendable tab 318 adjacent a second side 350 of the central opening 314 on a second side 330. The first bendable tab 316 is configured to be bent rearward away from the front face 352 of the mounting body 312 at a pre-formed bend feature (e.g., an elongate slot 354) that defines a first bend axis 324 (shown in FIG. 8), which is parallel to the elongate directions of the first set of keyhole features 302. Further, the second bendable tab 318 is configured to be bent rearward away from the front face 352 of the mounting body 312 at a pre-formed bend feature (e.g., an elongate slot 356) that defines a second bend axis 328 (shown in FIG. 8), which is perpendicular to the elongate directions of the second set of keyhole features 306 and the first bend axis 324. The mountable bracket 300 is also configured to be attachable to different size electrical boxes. For example, in some embodiments the mountable bracket 300 can be attachable to at least one of a 4-inch electrical box, a 4¹¹⁄₁₆-inch electrical box, or a 5-inch electrical box.

In some aspects, however, the brackets 100, 300 differ from each other. For example, the first bendable tab 316 is shown centered within the center opening 314 along the first side 320. Further, the mounting bracket 300 has a third bendable tab 338 adjacent the second side 350 of the central opening 314 on the second side 330 of the mounting body 312 and adjacent the second bendable tab 318. The third bendable tab 338 is configured to be bent rearward away from the front face 352 of the mounting body 312 at a pre-formed bend feature (e.g., an elongate slot 358) that defines a third bend axis 344 (shown in FIG. 8), which is parallel to the second bend axis 328 but spaced closer to the second attachment device 308. However, other arrangements are contemplated. Similar to the second bendable tab 318, the third bendable tab 338 is configured to be bent to extend at least partially over the interior side of a bottom side wall of an electrical box installed in key hole openings 310A and 310D of the third set of key hole features 310. Additionally, the key hole openings 310A and 310D extend in a direction of electrical box fastener engagement (i.e., fastener insertion direction) along the mounting body 312 that is perpendicular to the third bend axis 344 of the third bendable tab 338.

Additionally, the mounting bracket 300 has a fourth bendable tab 340 adjacent a third side 360 of the central opening 314 on a third side 342 of the mounting body 312. The third side 342 of the mounting body 312 is adjacent to and extends between the first and second sides 320, 330. The fourth bendable tab 340 is configured to be bent rearward away from the front face 352 of the mounting body 312 at a pre-formed bend feature (e.g., an elongate slot 362) that defines a fourth bend axis 346 (shown in FIG. 8), which extends parallel to the first bend axis 324 of the first bendable tab 316. Similar to the second and third bendable tabs 318, 338, the fourth bendable tab 340 is configured to be bent to extend at least partially over the interior side of a right side wall of an electrical box (according to the orientation of the mounting bracket shown in FIG. 8) installed in key hole openings 310B and 310C of the third set of key hole features 310. Also, the key hole openings 310B and 310C extend in a direction of electrical box fastener engagement (i.e., fastener insertion direction) along the mounting body 312 that is perpendicular to the fourth bend axis 346 of the fourth bendable tab 340.

Figure 10:
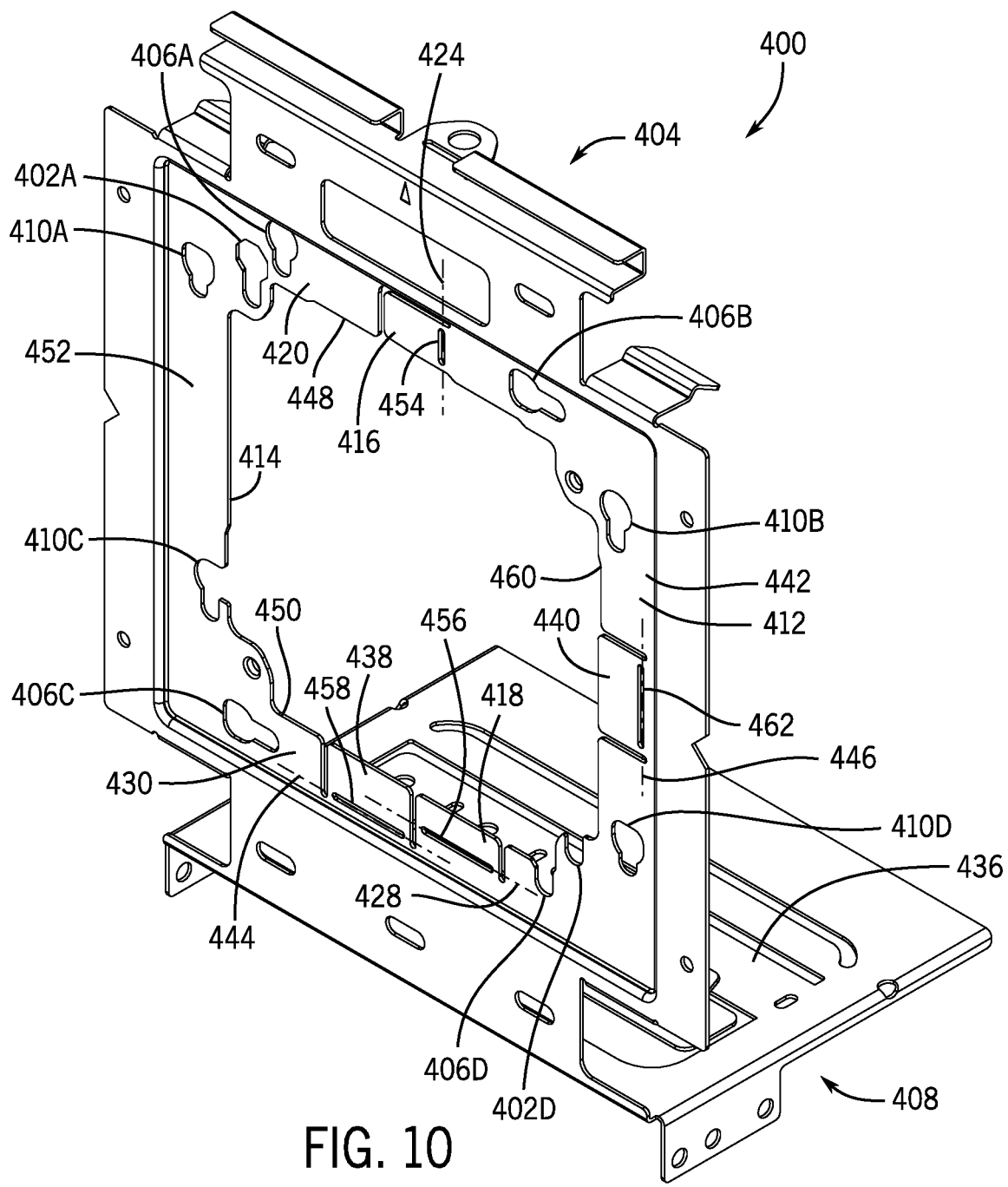
FIG. 10 is a front top right isometric view of a mounting bracket according to another embodiment of the invention.
Figure 11:
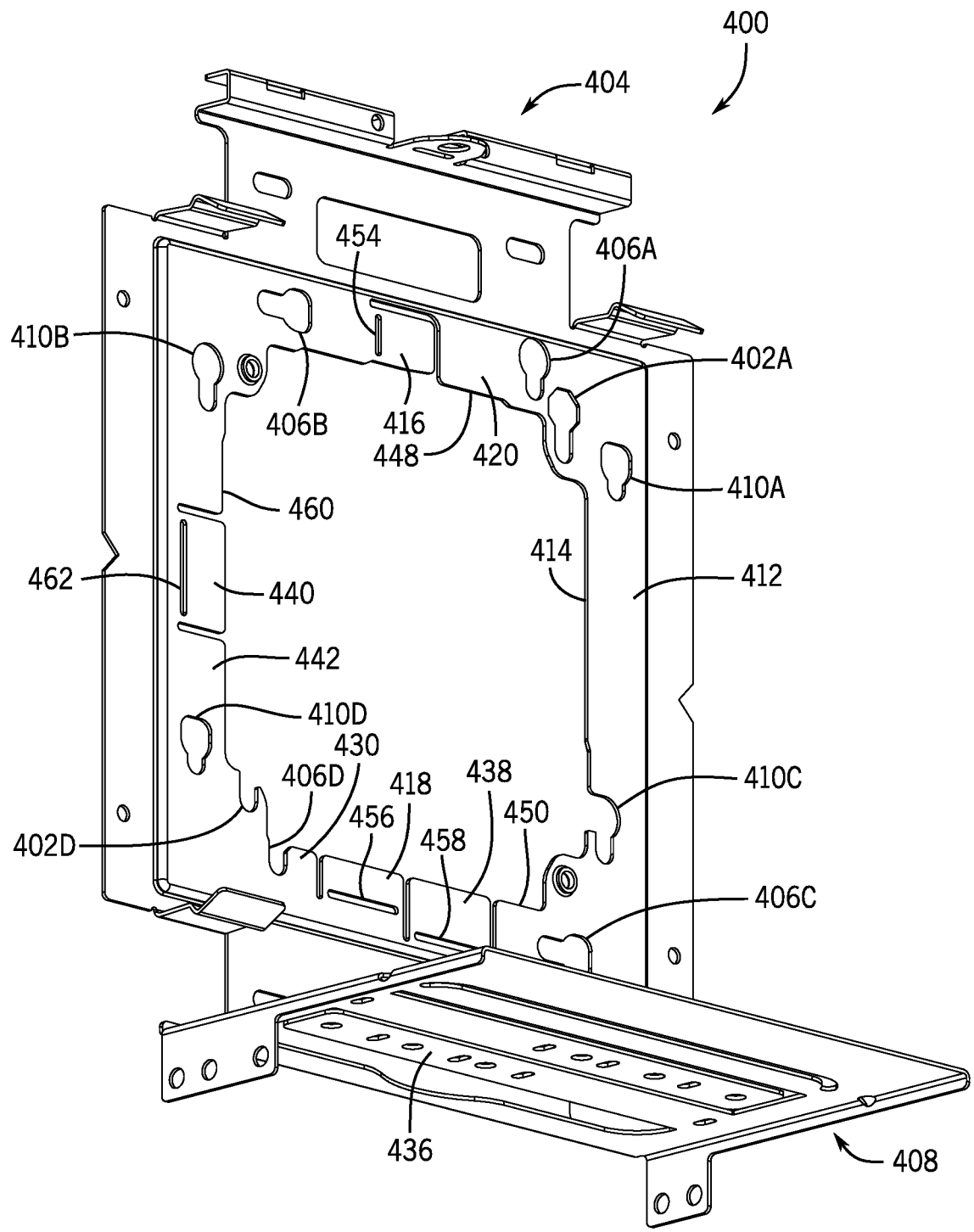
FIG. 11 is a rear bottom right isometric view of the mounting bracket of FIG. 10.

FIGS. 10 and 11 illustrate another embodiment of a mounting bracket 400 according to the invention, as also can be attached to an electrical box (for example, the electrical boxes 10, 20 shown in FIGS. 4 and 5, respectively). In many aspects, the mounting bracket 400 is similar to a combination of the mounting brackets 200, 300 described above and similar numbering in the 400 series is used for the mounting brackets 200, 300. For example, with respect to similarities to the mounting bracket 300, the mounting bracket 400 has a first attachment device 404 and a mounting body 412 with a front face 452, a plurality of keyhole features, in similar orientations, including a first set of keyhole features (collectively referred to with number 402), a second set of keyhole features (collectively referred to with number 406), and a third set of keyhole features (collectively referred to with number 410). The mounting bracket 400 also has a first bendable tab 416 adjacent a first side 448 of a central opening 414 on a first side 420 and configured to be bent rearward away from the front face 452 of the mounting body 412 at a pre-formed bend feature (e.g., an elongate slot 454) that defines a first bend axis 424 (shown in FIG. 10) and a second bendable tab 418 adjacent a second side 450 of the central opening 414 on a second side 430 configured to be bent rearward away from the front face 452 of the mounting body 412 at a pre-formed bend feature (e.g., an elongate slot 456) that defines a second bend axis 428 (shown in FIG. 10). The mounting bracket 400 also includes a third bendable tab 438 adjacent the second side 450 of the central opening 414 on the second side 430 of the mounting body 412 and adjacent the second bendable tab 418. The third bendable tab 438 is configured to be bent rearward away from the front face 452 of the mounting body 412 at a pre-formed bend feature (e.g., an elongate slot 458) that defines a third bend axis 444 (shown in FIG. 10). Additionally, the mounting bracket 400 has a fourth bendable tab 440 adjacent a third side 460 of the central opening 414 on a third side 442 of the mounting body 412. The fourth bendable tab 440 is configured to bent rearward away from the front face 452 of the mounting body 412 at a pre-formed bend feature (e.g., an elongate slot 462) that defines a fourth bend axis 446 (shown in FIG. 10).

With respect to similarities with the mounting bracket 200, the mounting bracket 400 has a far side support device 408 that is configured to mount the mounting bracket 400 to a vertical wall support member (not shown). The far side support device 408 is configured to prevent the mounting bracket 400 from bending into the wall space by abutting a wall covering (not shown) attached to the opposite side of the wall to which the attachment device 404 is mounted. The far side support device 408 also includes bendable supports 434 configured to be bent toward and attached to the vertical wall support member with a fastener (not shown).

Additionally, the mountable bracket 400 is configured to be attachable to different size electrical boxes. For example, in some embodiments the mountable bracket 400 can be attachable to at least one of a 4-inch electrical box, a 4¹¹⁄₁₆-inch electrical box, or a 5-inch electrical box.

Figure 12:
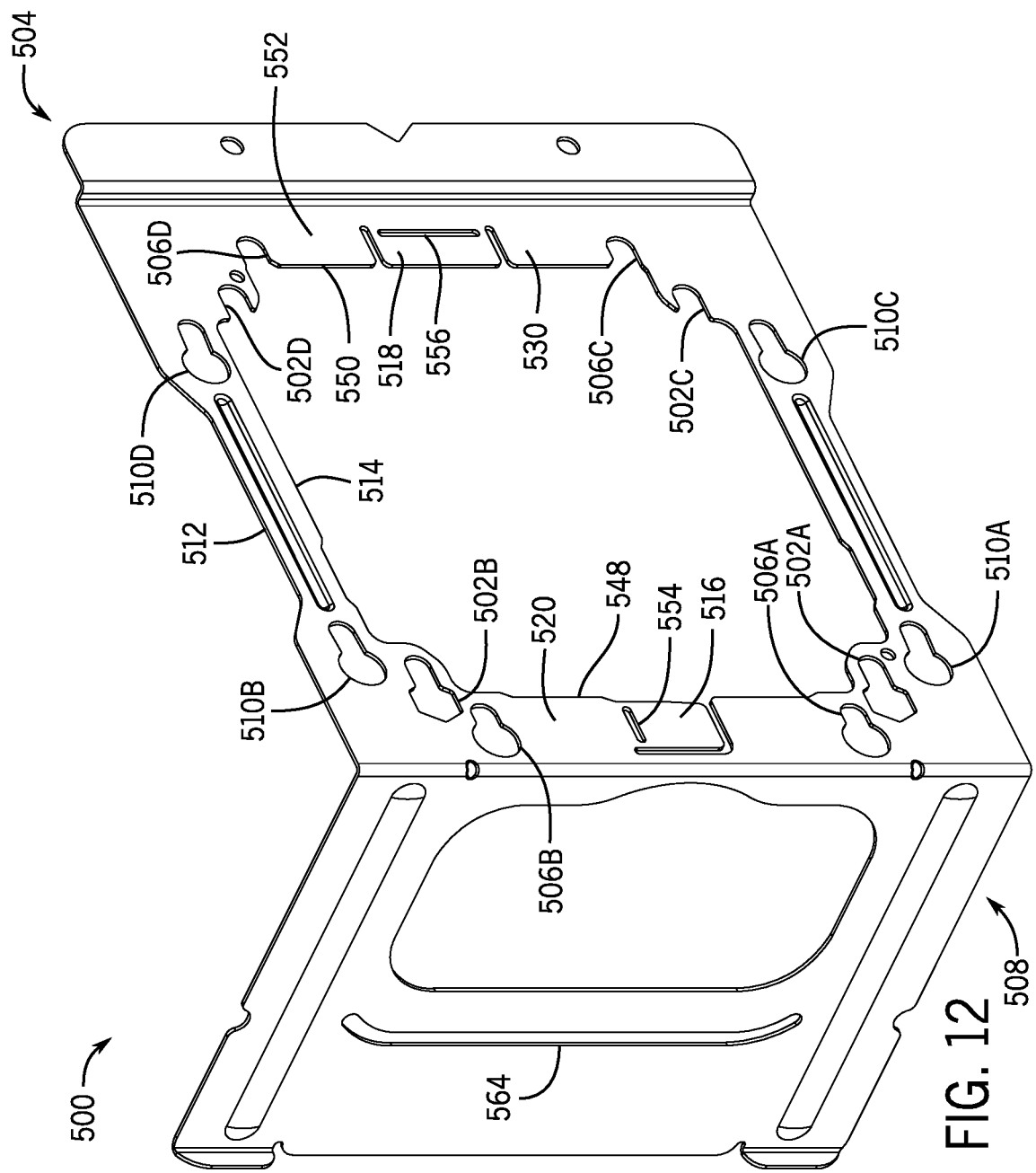
FIG. 12 is a front top left isometric view of a mounting bracket according to another embodiment of the invention.
Figure 13:
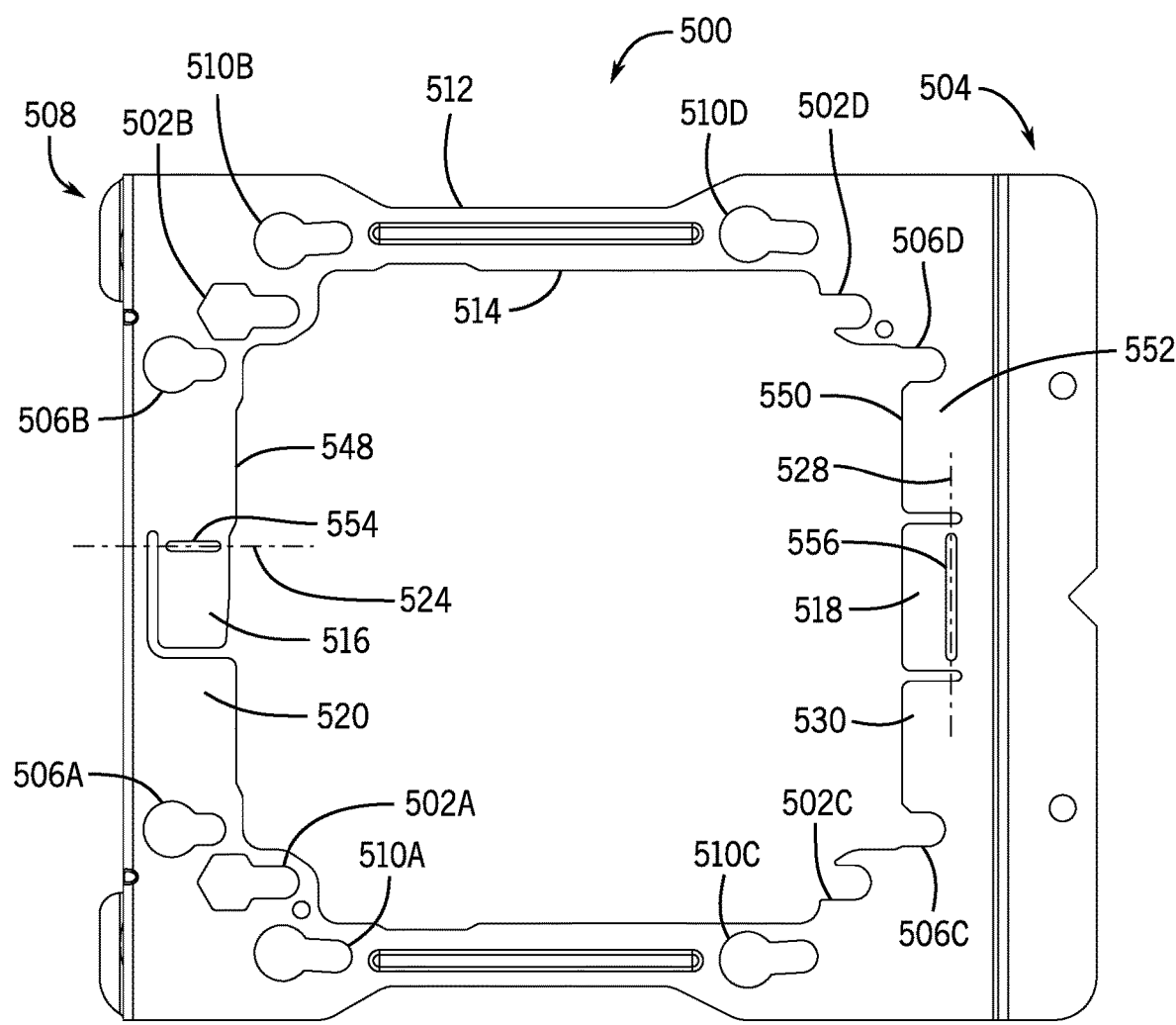
FIG. 13 is a front elevation view of the mounting bracket of FIG. 12.
Figure 14:
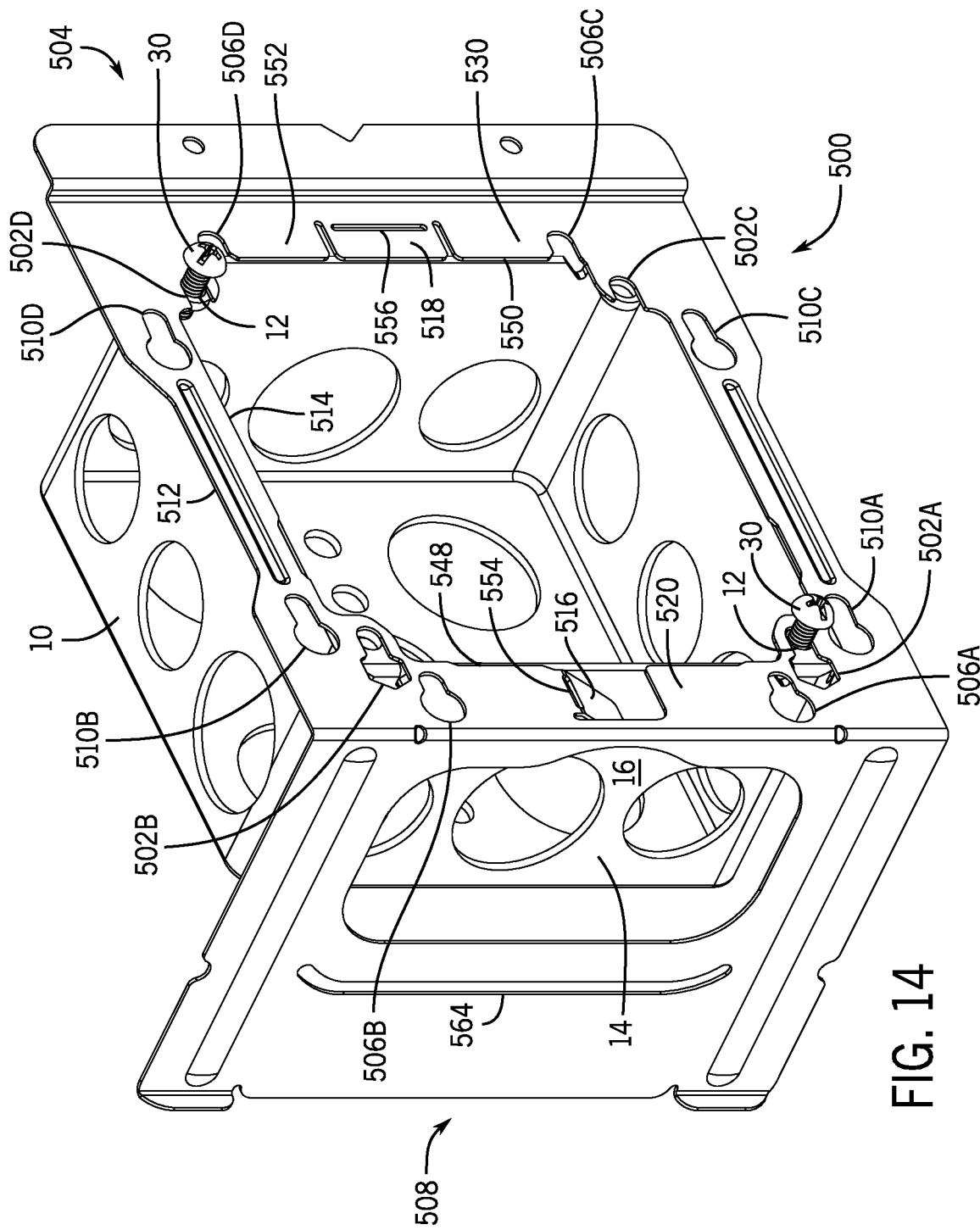
FIG. 14 is a front top left perspective view of the mounting bracket of FIG. 12 attached to the first electrical box according to an embodiment of the invention.
Figure 15:
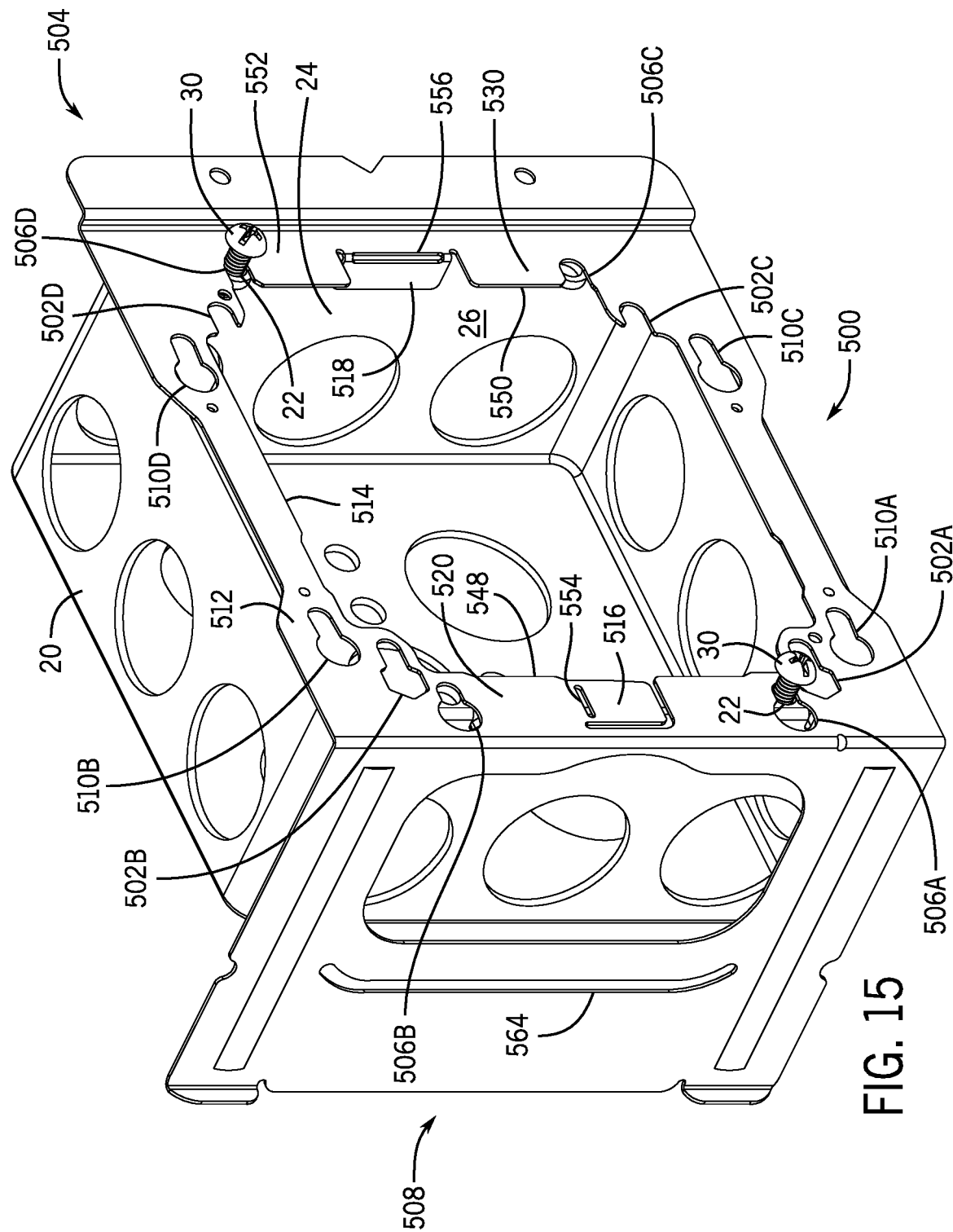
FIG. 15 is a front top left perspective view of the mounting bracket of FIG. 12 attached to the second electrical box according to an embodiment of the invention.

FIGS. 12 through 15 illustrate another embodiment of a mounting bracket 500 according to the invention, as also can be attached to an electrical box 10, 20 (shown in FIGS. 14 and 15, respectively). In many aspects, the mounting bracket 500 is similar to the mounting bracket 100 described above and similar numbering in the 500 series is used for the mounting bracket 500. For example, the mounting bracket 500 has a mounting body 512 with a plurality of keyhole features including a first set of keyhole features (collectively referred to with number 502), a second set of keyhole features (collectively referred to with number 506), a third set of keyhole features (collectively referred with number 510), a first bendable tab 516, and a second bendable tab 518. The first bendable tab 516 is adjacent a first side 548 of a central opening 514 on a first side 520, the side from which the engaging direction (see definition above with respect to the mounting bracket 100) is pointing away. The second bendable tab 518 is adjacent a second side 550 of the central opening 514 on a second side 530, the side to which the engaging direction is pointing. The first bendable tab 516 is configured to be bent rearward away from a front face 552 of the mounting body 512 at a pre-formed bend feature (e.g., an elongate slot 554) that defines a first bend axis 524 (shown in FIG. 13), which is parallel to the elongate directions of the first set of keyhole features 502. Additionally, the first bendable tab 516 is located on the first side 520. Further, the second bendable tab 518 is configured to be bent rearward away from the front face 552 of the mounting body 512 at a pre-formed bend feature (e.g., an elongate slot 556) that defines a second bend axis 528 (shown in FIG. 13), which is perpendicular to the elongate directions of the second and third sets of keyhole features 506, 510 and the first bend axis 524.

The mountable bracket 500 is also configured to be attachable to different size electrical boxes. For example, the mountable bracket 500 is shown attached to a 4-inch electrical box 10 in FIG. 14 and a 4¹¹⁄₁₆-inch electrical box 20 in FIG. 15, but other box sizes (e.g., a 5-inch box) are also contemplated. Further, in other embodiments, another bendable tab, similar to or different than the second bendable tab 518, could be provided next to the second bendable tab 518, or at various other locations. In some cases, an additional bendable tab can be configured to retain a different size electrical box (e.g., a 5-inch electrical box).

In some aspects, however, the brackets 100, 500 differ from each other. For example, the mounting bracket 500 has a far side support device 508 extending from the first side 520 and an attachment device 504 extending from the second side 530. The attachment device 504 is configured to mount the mounting bracket 500 to a vertical wall support member (not shown), and the far side support device 508 is configured to prevent the mounting bracket 500 from bending into the wall space by abutting a wall covering (not shown) attached to the opposite side of the wall to which the attachment device 504 is mounted. The far side support device 508 can be configured to be modified for multiple wall depths. For example, in the configuration of the far side support device 508 as shown in FIGS. 12 through 15, the bracket 500 is set to be installed in a wall with a depth of 3⅝ inches. Further, the far side support device 508 can be configured for a 2½-inch wall depth by bending along a relief feature 564). Further, with reference to the mounting bracket 500 and the orientation thereof as shown in FIGS. 12 and 13, the keyhole openings 502A, 506A, 510A are located in the lower left corner of the mounting body 512; the keyhole openings 502B, 506B, 510B are located in the upper left corner; the keyhole slots 502C, 506C, 510C are located in the lower right corner; and the keyhole slots 502D, 506D, 510D are located in the upper right corner. The keyhole openings 502A, 502B, 506A, 506B, 510A, 510B and the keyhole slots 510C, 510D are separate, self-contained, features spaced from the center opening 514. The keyhole slots 502C, 502D, 506C, 506D are defined by the central opening 514. In some embodiments, the keyhole slots 502C, 502D, 506C, 506D can be configured similarly to the keyhole openings 502A, 502B, 506A, 506B, 510A, 510B and the keyhole slots 510C, 510D (i.e., separate, self-contained, and spaced from the central opening 514).

Although the location of the keyhole openings 502A, 502B, 506A, 506B, 510A, 510B and the keyhole slots 502C, 502D, 506C, 506D, 510C, 510D in the mounting body 512 are different with respect to the mounting orientation of the mounting bracket 500 than that of the mounting bracket 100, the positioning thereof relative to the first and second bendable tabs 516, 518 is similar. Looking at FIG. 13, the keyhole openings 502A, 502B, 506A, 506B, 510A, 510B extend in a parallel arrangement along the mounting body 512. Each keyhole opening of sets of corresponding keyholes 502A/502B, 506A/506B, 510A/510B is collaterally spaced from the other of the set. Similarly, the keyhole slots 502C, 502D, 506C, 506D, 510C, 510D extend in a parallel arrangement, with each keyhole slot of sets of corresponding keyhole slots 502C/502D, 506C/506D, 510C/510D collaterally spaced from the other of the set. Further, the keyhole openings 502A, 506A, 510A are aligned with the respective keyhole slots 502C, 506C, 510C, and keyhole openings 502B, 506B, 510B are aligned with the respective keyhole slots 502D, 506D, 510D.

Figure 16:
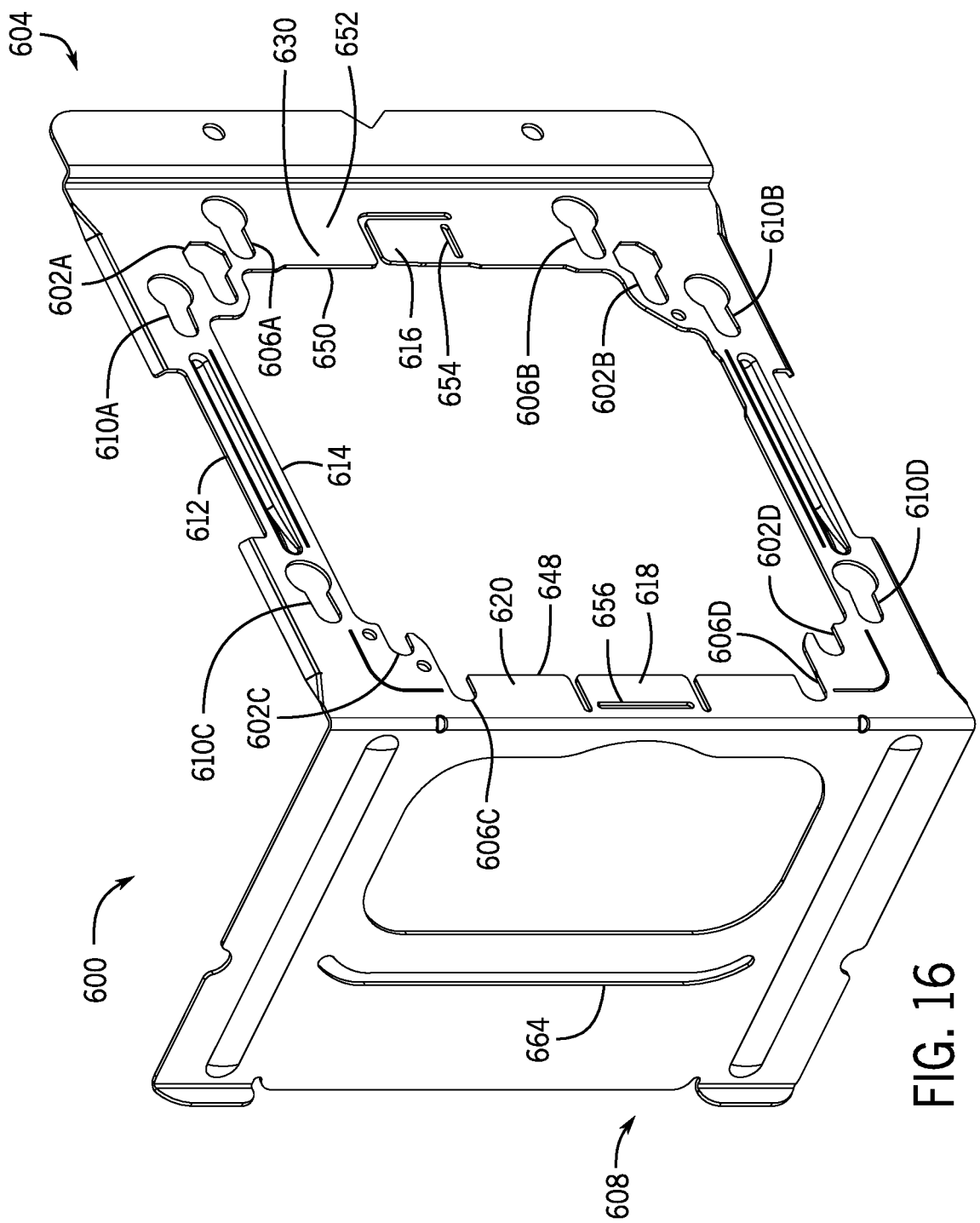
FIG. 16 is a front top left isometric view of a mounting bracket according to another embodiment of the invention.
Figure 17:
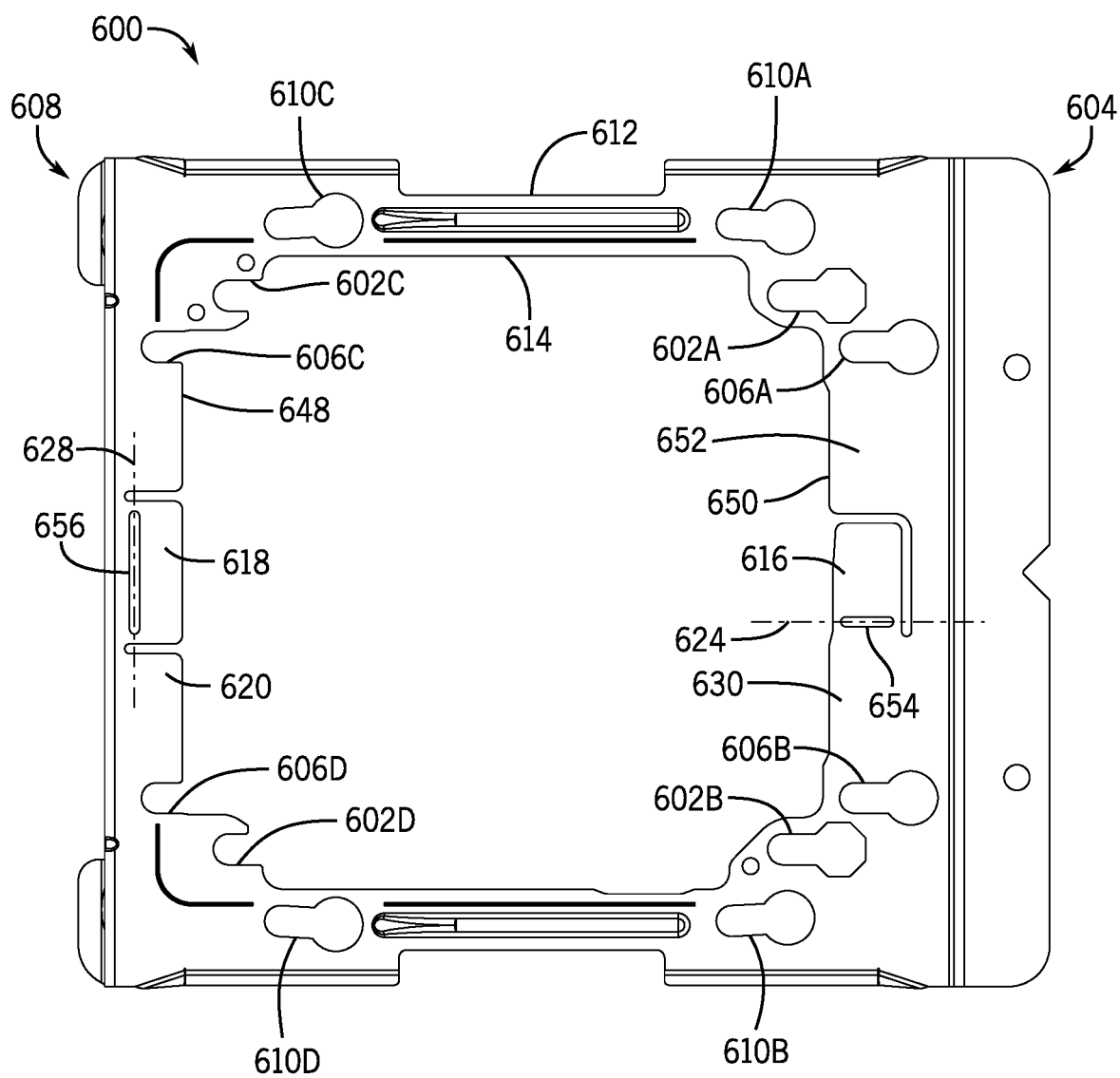
FIG. 17 is a front elevation view of the mounting bracket of FIG. 16.
Figure 18:
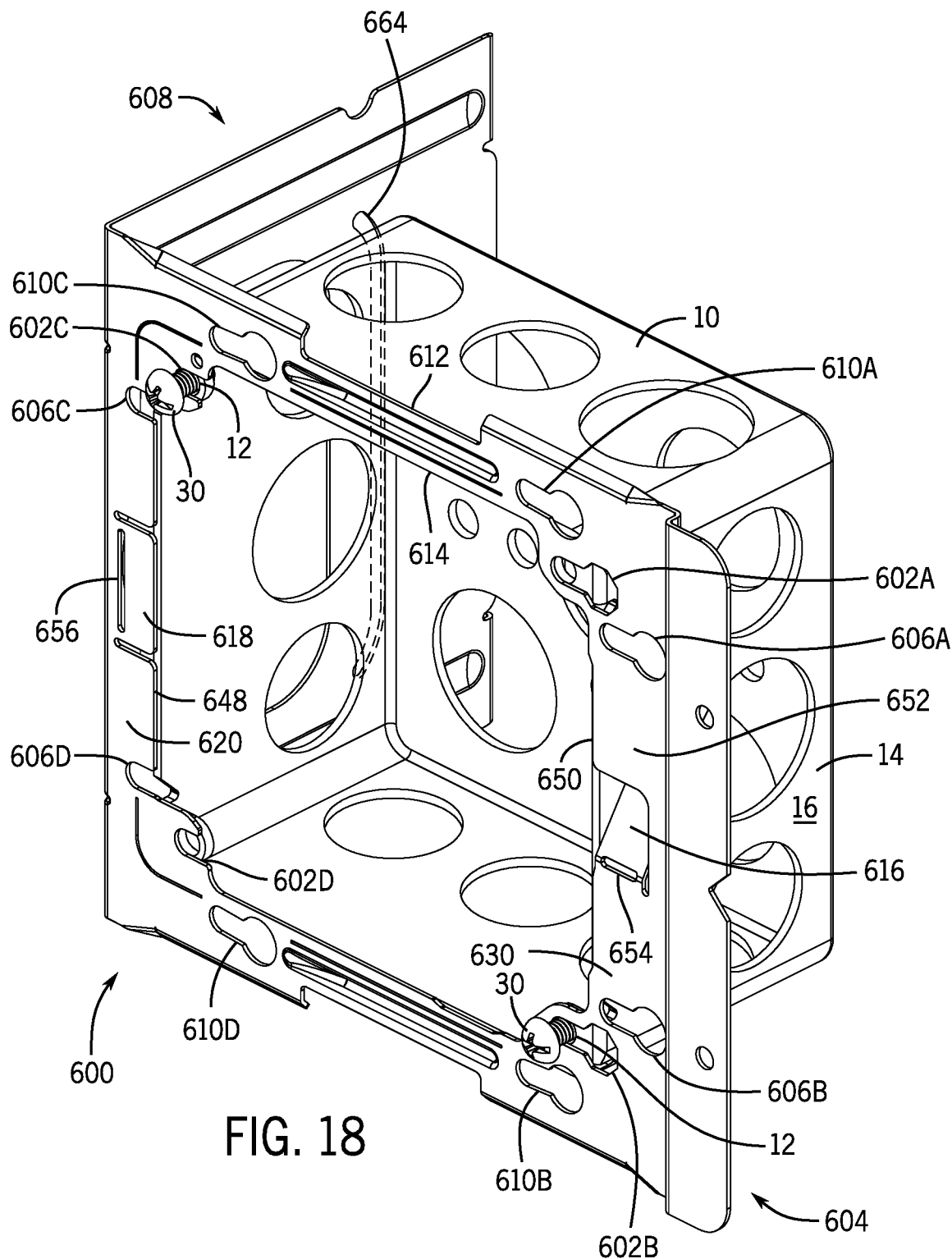
FIG. 18 is a front top right perspective view of the mounting bracket of FIG. 16 attached to the first electrical box according to an embodiment of the invention.
Figure 19:
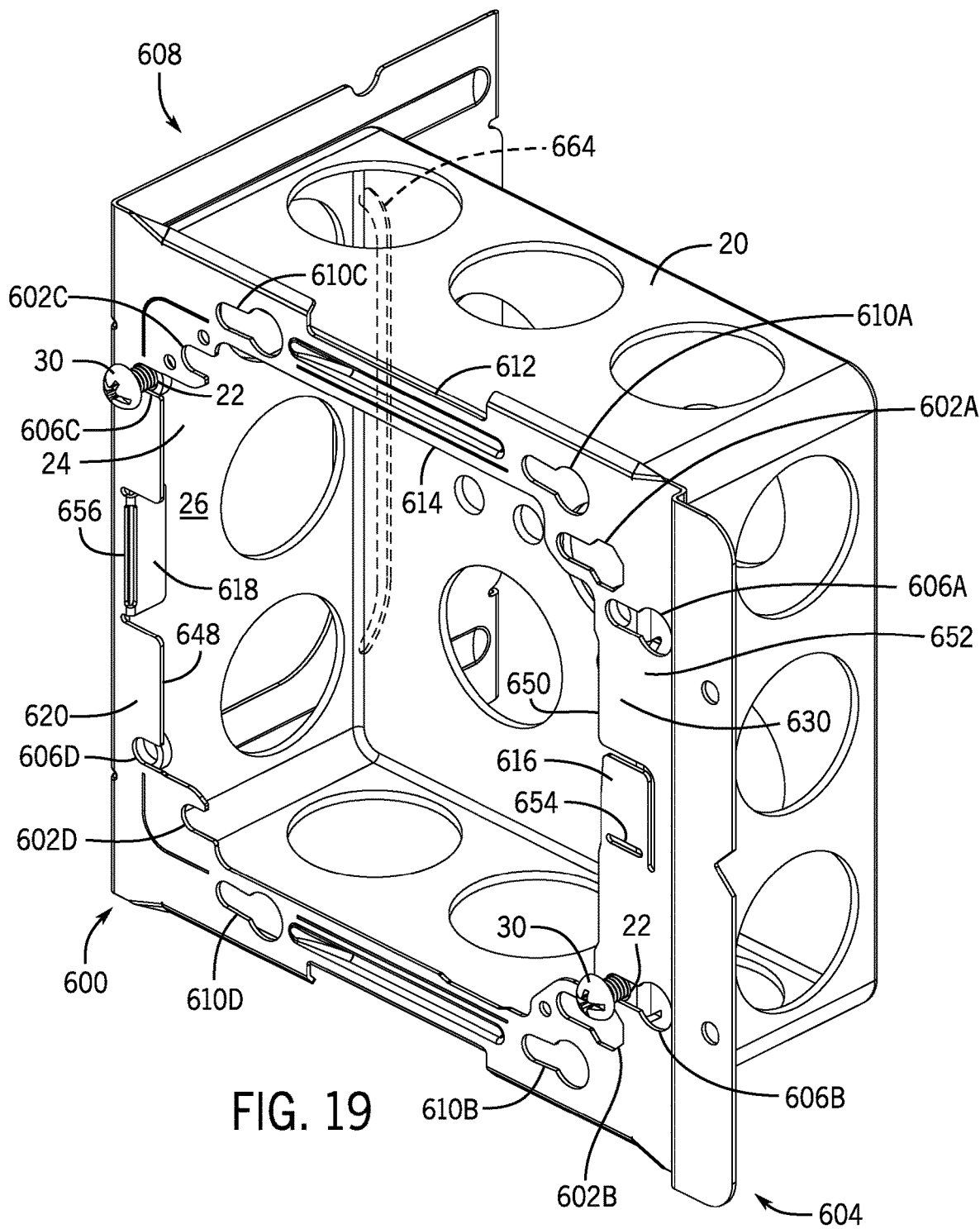
FIG. 19 is a front top right perspective view of the mounting bracket of FIG. 16 attached to the second electrical box according to an embodiment of the invention.

FIGS. 16 through 19 illustrate another embodiment of a mounting bracket 600 according to the invention, as also can be attached to an electrical box 10, 20 (shown in FIGS. 18 and 19, respectively). In many aspects, the mounting bracket 600 is similar to the mounting bracket 500 described above and similar numbering in the 600 series is used for the mounting bracket 600. For example, the mounting bracket 600 has a mounting body 612 with a central opening 614 and a plurality of keyhole features including a first set of keyhole features (collectively referred to with number 602), a second set of keyhole features (collectively referred to with number 606), a third set of keyhole features (collectively referred with number 610), a first bendable tab 616, and a second bendable tab 618.

The mounting bracket 600 also has a far side support device 608 extending from the first side 620 and an attachment device 604 extending from the second side 630. Similarly, the attachment device 604 is configured to mount the mounting bracket 600 to a vertical wall support member (not shown), and the far side support device 608 is configured to prevent the mounting bracket 600 from bending into the wall space by abutting a wall covering (not shown) attached to the opposite side of the wall to which the attachment device 604 is mounted. For example, as shown, the far side support device 608 is configured to be modified for multiple wall depths (e.g., a 3⅝-inch wall depth, as shown in FIGS. 16 through 19, and a 2½-inch wall depth when bent along a relief feature 664). Additionally, the mountable bracket 600 is configured to be attachable to different size electrical boxes. For example, the mountable bracket 600 is shown attached to a 4-inch electrical box 10 in FIG. 18 and a 4¹¹⁄₁₆-inch electrical box 20 in FIG. 19, but other box sizes (e.g., a 5-inch box) are also contemplated.

In some aspects, however, the brackets 500, 600 differ from each other. For example, the first bendable tab 616, the second bendable tab 618, and the first, second, and third keyhole features 602, 606, 610 have rotated 180 degrees on the mounting body around the central opening 614. The first bendable tab 616 is located on the second side 630 and the second bendable tab 618 is located on the first side 620. Further, with reference to the mounting bracket 600 and the orientation thereof as shown in FIGS. 16 and 17, the keyhole openings 602A, 606A, 610A are located in the upper right corner of the mounting body 612; the keyhole openings 602B, 606B, 610B are located in the lower right corner; the keyhole slots 602C, 606C, 610C are located in the upper left corner; and the keyhole slots 602D, 606D, 610D are located in the lower left corner.

Although the bendable tabs 616, 618 and the keyhole features 606, 606, 610 of the bracket 600 have moved, the relative configurations and special relationships remain similar to those provided on the bracket 500. For example, the keyhole openings 602A, 602B, 606A, 606B, 610A, 610B and the keyhole slots 610C, 610D are separate, self-contained, features spaced from the central opening 614, and the keyhole slots 602C, 602D, 606C, 606D are defined by the central opening 614. Further, although the first bendable tab 616 is located adjacent a second side 650 of the central opening 614 on the second side 630 of the mounting body 612, it is configured to be bent rearward away from a front face 652 of the mounting body 612 at a pre-formed bend feature (e.g., an elongate slot 654) that defines a first bend axis 624 (shown in FIG. 17), which is parallel to the elongate directions of the first set of keyhole features 502. Further, the first bendable tab 616 is located on the second side 630, the side from which the engaging direction (see definition above with respect to the mounting bracket 100) is pointing away. Also, although the second bendable tab 618 is located adjacent a first side 648 of the central opening 614 on the first side 620 of the mounting body 612, it is configured to be bent rearward away from the front face 652 of the mounting body 612 at a pre-formed bend feature (e.g., an elongate slot 656) that defines a second bend axis 628 (shown in FIG. 17), which is perpendicular to the elongate directions of the second and third sets of keyhole features 606, 610 and the first bend axis 624. Additionally, the second bendable tab 618 is located on the first side 620, the side to which the engaging direction is pointing.

Figure 20:
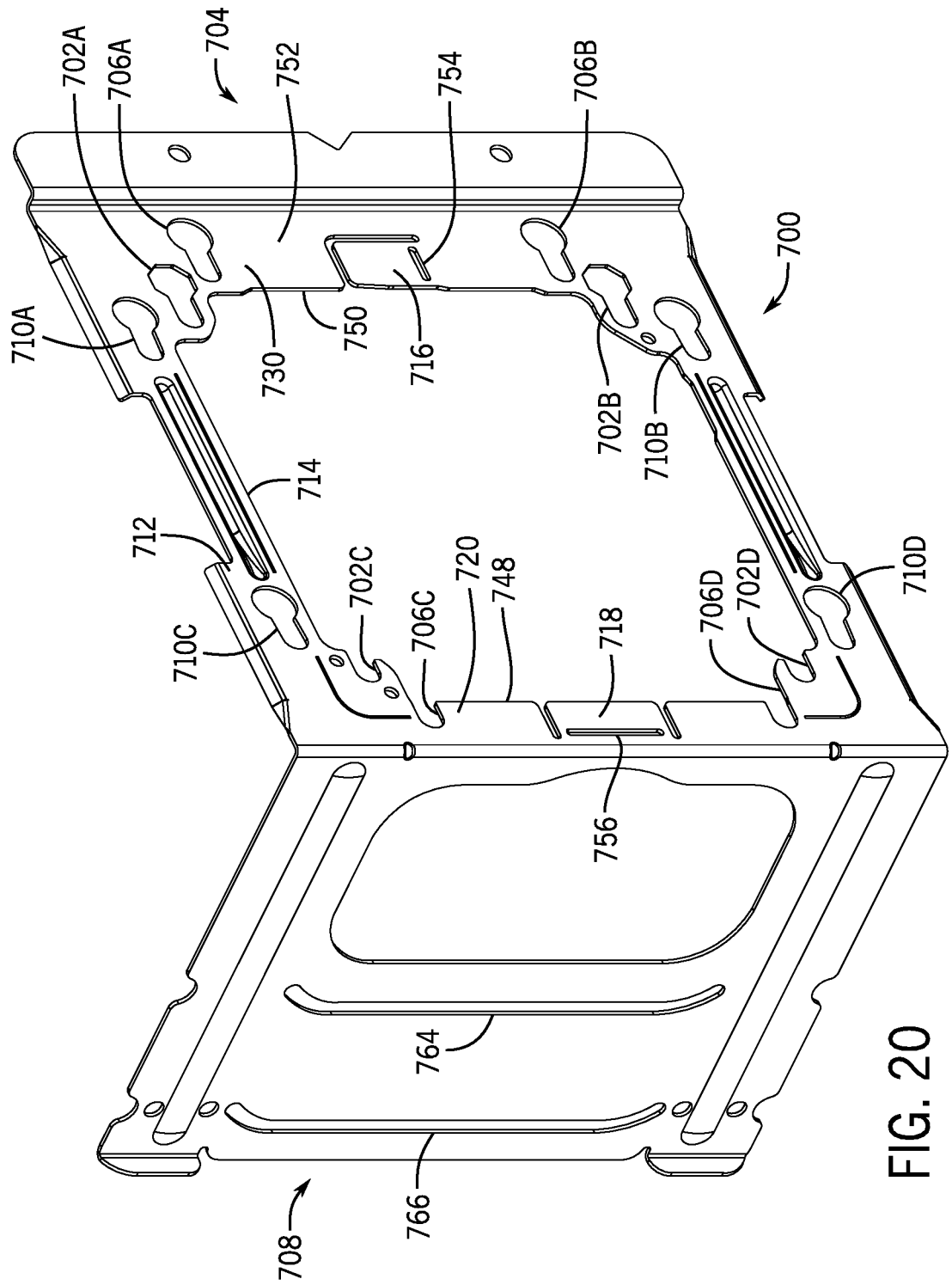
FIG. 20 is a front top left isometric view of a mounting bracket according to another embodiment of the invention.
Figure 21:
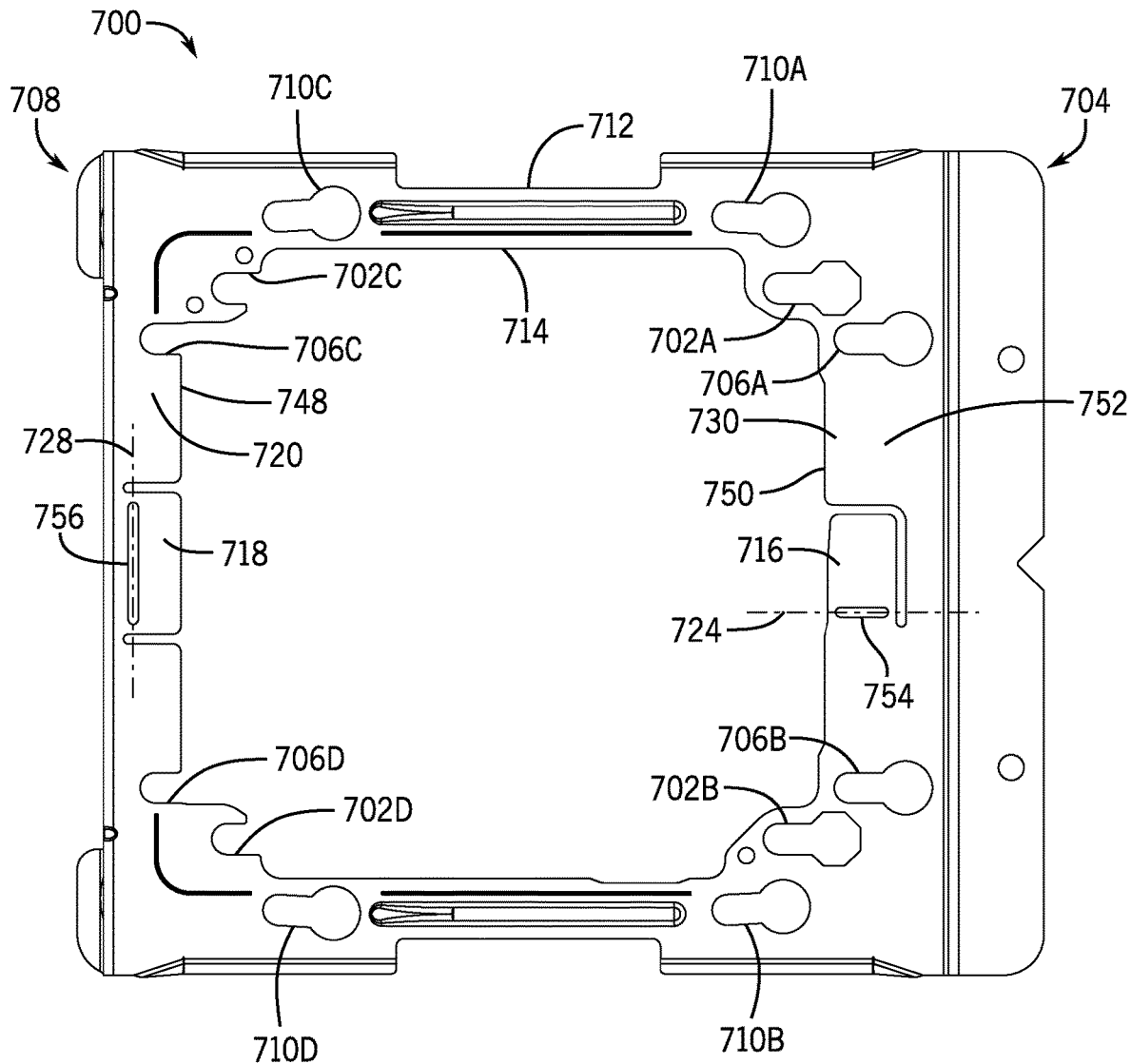
FIG. 21 is a front elevation view of the mounting bracket of FIG. 20.

FIGS. 20 and 21 illustrate another embodiment of a mounting bracket 700 according to the invention, as also can be attached to an electrical box (e.g., the electrical boxes 10, 20 shown in FIGS. 18 and 19, respectively). In many aspects, the mounting bracket 700 is similar to the mounting bracket 600 described above and similar numbering in the 700 series is used for the mounting bracket 700. For example, the mounting bracket 700 has a mounting body 712 with a central opening 714 and a plurality of keyhole features including a first set of keyhole features (collectively referred to with number 702), a second set of keyhole features (collectively referred to with number 706), a third set of keyhole features (collectively referred with number 710), a first bendable tab 716 adjacent a second side 750 of the central opening 714 on a second side 730, and a second bendable tab 718 adjacent a first side 748 of the central opening 714 on a first side 720. The first bendable tab 716 is configured to be bent rearward away from a front face 752 of the mounting body 712 at a pre-formed bend feature (e.g., an elongate slot 754) that defines a first bend axis 724 (shown in FIG. 21), which is parallel to the elongate directions of the first set of keyhole features 702. Further, the second bendable tab 718 is configured to be bent rearward away from the front face 752 of the mounting body 712 at a pre-formed bend feature (e.g., an elongate slot 756) that defines a second bend axis 728 (shown in FIG. 21), which is perpendicular to the elongate directions of the second and third sets of keyhole features 706, 710 and the first bend axis 724.

The mounting bracket 700 also has a far side support device 708 extending from the first side 720 and an attachment device 704 extending from the second side 730. Similarly, the attachment device 704 is configured to mount the mounting bracket 700 to a vertical wall support member (not shown), and the far side support device 708 is configured to prevent the mounting bracket 700 from bending into the wall space by abutting a wall covering (not shown) attached to the opposite side of the wall to which the attachment device 704 is mounted. Additionally, the mountable bracket 700 is configured to be attachable to different size electrical boxes. For example, the mountable bracket 700 can be configured to be attachable to at least one of a 4-inch electrical box (e.g., the electrical box 10 shown in FIG. 18), a $4^{11}/_{16}$-inch electrical box (e.g., the electrical box 20 shown in FIG. 19) or a 5-inch electrical box. However, other box sizes are contemplated.

In some aspects, however, the brackets 600, 700 differ from each other. For example, the far side support device 708 is configured to be modified for multiple wall depths similar to the far side support device 608 of the bracket 600 (e.g., a 2½-inch wall depth when bent along a relief feature 764 and a 3⅝-inch wall depth when bent along a relief feature 766), but the far side support device 708 is also configured to be used within a wall having a depth of four inches, in the unbent state as shown in FIG. 20.

Figure 22:
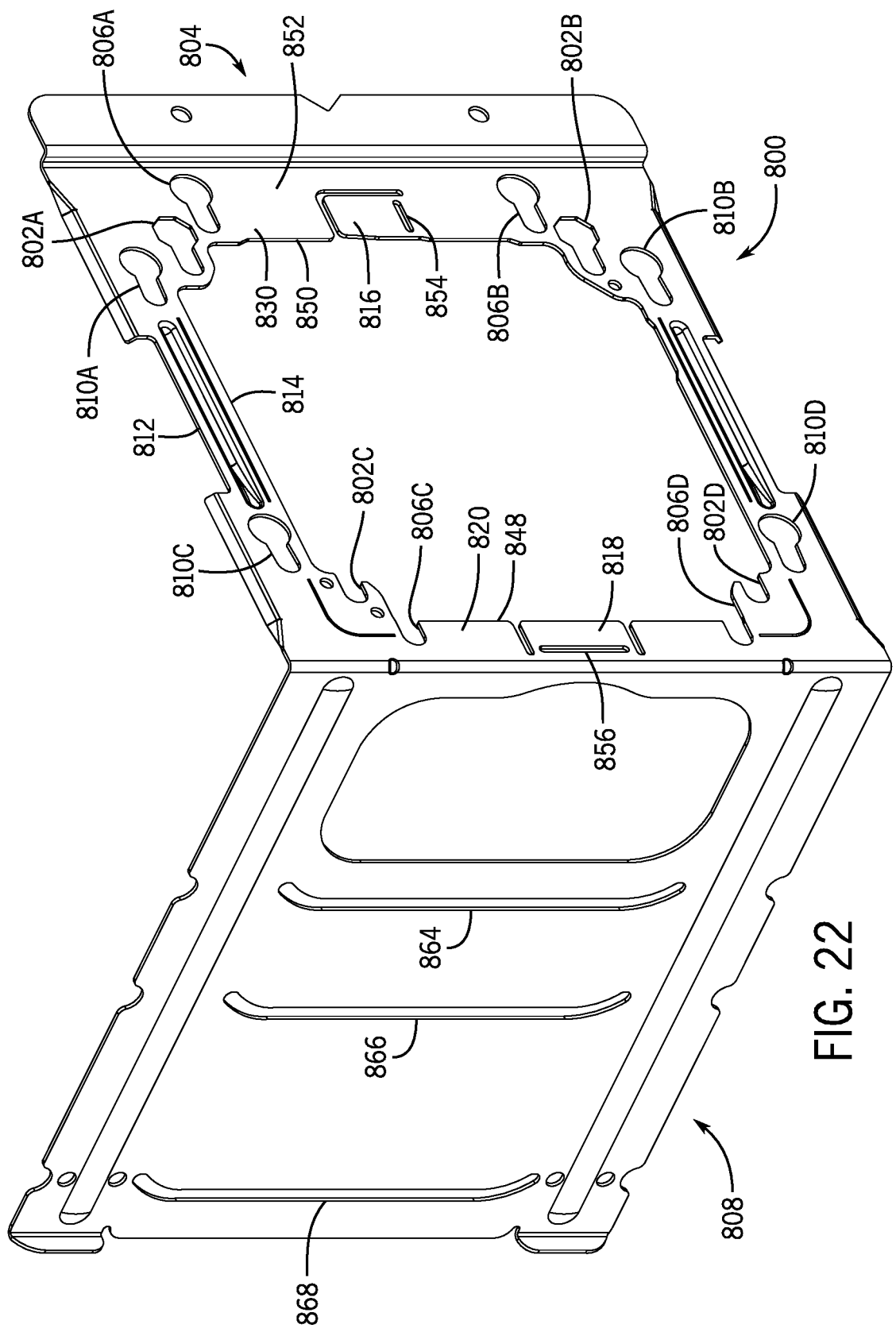
FIG. 22 is a front top left isometric view of a mounting bracket according to another embodiment of the invention.
Figure 23:
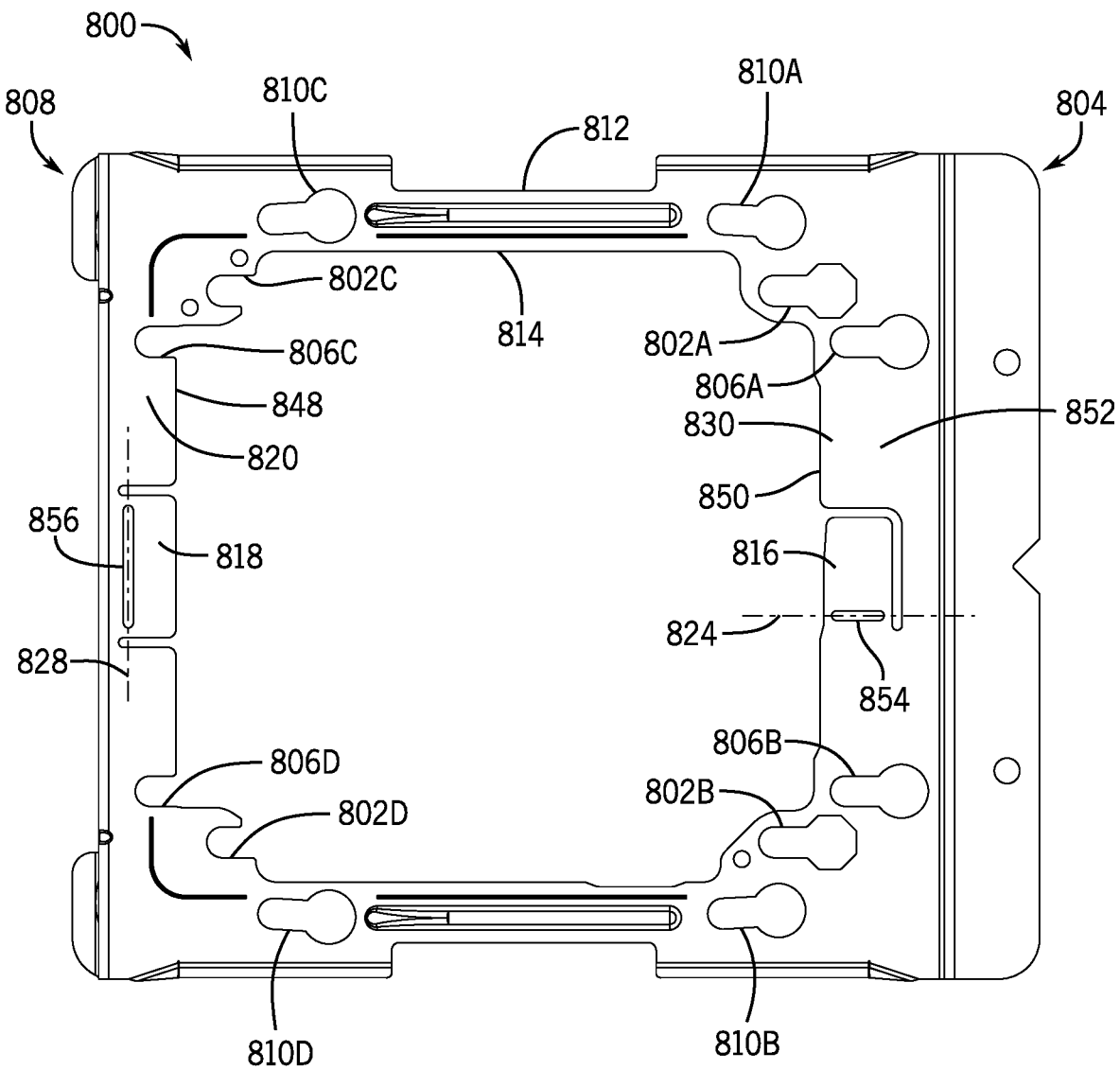
FIG. 23 is a front elevation view of the mounting bracket of FIG. 22.

FIGS. 22 and 23 illustrate another embodiment of a mounting bracket 800 according to the invention, as also can be attached to an electrical box (e.g., the electrical boxes 10, 20 shown in FIGS. 18 and 19, respectively). In many aspects, the mounting bracket 800 is similar to the mounting bracket 600 described above and similar numbering in the 800 series is used for the mounting bracket 800. For example, the mounting bracket 800 has a mounting body 812 with central opening 814 and a plurality of keyhole features including a first set of keyhole features (collectively referred to with number 802), a second set of keyhole features (collectively referred to with number 806), a third set of keyhole features (collectively referred with number 810), a first bendable tab 816 adjacent a second side of the central opening 814 on a second side 830, and a second bendable tab 818 adjacent a first side of the central opening 814 on a first side 820. The first bendable tab 816 is configured to be bent rearward away from a front face 852 of the mounting body 812 at a pre-formed bend feature (e.g., an elongate slot 854) that defines a first bend axis 824 (shown in FIG. 23), which is parallel to the elongate directions of the first set of keyhole features 802. Further, the second bendable tab 818 is configured to be bent rearward away from the front face 852 of the mounting body 812 at a pre-formed bend feature (e.g., an elongate slot 856) that defines a second bend axis 828 (shown in FIG. 23), which is perpendicular to the elongate directions of the second and third sets of keyhole features 806, 810 and the first bend axis 824.

The mounting bracket 800 also has a far side support device 808 extending from the first side 820 and an attachment device 804 extending from the second side 830. Similarly, the attachment device 804 is configured to mount the mounting bracket 800 to a vertical wall support member (not shown), and the far side support device 808 is configured to prevent the mounting bracket 800 from bending into the wall space by abutting a wall covering (not shown) attached to the opposite side of the wall to which the attachment device 804 is mounted. Additionally, the mountable bracket 800 is configured to be attachable to different size electrical boxes. For example, the mountable bracket 800 can be configured to be attachable to at least one of a 4-inch electrical box (e.g., the electrical box 10 shown in FIG. 18), a $4^{11}/_{16}$-inch electrical box (e.g., the electrical box 20 shown in FIG. 19) or a 5-inch electrical box. However, other box sizes are contemplated.

In some aspects, however, the brackets 600, 800 differ from each other. For example, the far side support device 808 is configured to be modified for multiple wall depths similar to the far side support device 608 of the bracket 600 (e.g., a 2½ inch wall depth when bent along a relief feature 864 and a 3⅝ inch wall depth when bent along a relief feature 866), but the far side support device 808 is also configured to be used within walls having depths of 5½ inches when bent along a relief feature 868) and six inches, in the unbent state as shown in FIG. 22.

In other embodiments, other configurations are possible. For example, certain features and combinations of features that are presented with respect to particular embodiments in discussion above, can be utilized in other embodiments and in other combinations, as appropriate. In this regard, for example, different configurations of keyhole features and bending tabs, and so on, as presented with respect to a particular one of the mounting brackets 100, 200, 300, 400, 500, 600, 700, 800 can be implemented in combination with features of the other mounting brackets 100, 200, 300, 400, 500, 600, 700, 800, or others.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

For example, with reference to FIG. 4, some embodiments can include an installation method under which a user can install the electrical box 10 to the mounting bracket 100. The method can include inserting the plurality of fasteners 30 that are engaged with the electrical box 10 into the keyhole features 102 in the mounting body 112 of the mounting bracket 100, translating the fasteners 30 into the engaging portions 122B, 122C of the at least two of the plurality of keyhole features 102, and bending the bendable tab 116 on the mounting body 112 to engage a side wall 14 of the electrical box 10 to secure the fasteners 30 within the engaging portions 122B, 122C of the keyhole features 102, as well as other activities expressly or implicitly discussed above. Similar methods can also be implemented relative to the bendable tab 118, as shown in FIG. 5, or other bendable tabs as generally disclosed herein (e.g., as shown in the various other FIGS.).

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A mounting bracket for electrical boxes, the mounting bracket comprising:
    an integrally-formed mounting body that includes:
        a central opening sized for access to an interior of an electrical box;
        a plurality of keyhole features arranged around the central opening, including a first set of keyhole features oriented to selectively receive first fasteners along a first elongate direction to secure a first electrical box to the mounting bracket and a second set of keyhole features oriented to selectively receive second fasteners along a second elongate direction to secure a second electrical box to the mounting bracket;
        a first bendable tab located adjacent a first side of the central opening on a first side of the mounting body; and
        a second bendable tab located adjacent a second side of the central opening on a second side of the mounting body, opposite the first side of the central opening, at least one of the first bendable tab or the second bendable tab defining part of an edge of the central opening;
    the first bendable tab being bendable, about a first pre-formed bend feature that defines a first-tab bend axis, rearward away from a front face of the mounting body to engage an exterior surface of a side wall of the first electrical box and thereby secure the first fasteners within the first set of keyhole features; and
    the second bendable tab being bendable, about a second pre-formed bend feature that defines a second-tab bend axis that is perpendicular to the first-tab bend axis, rearward away from the front face of the mounting body to engage an interior surface of a side wall of the second electrical box and thereby secure the second fasteners within the second set of keyhole features.

2. The mounting bracket of claim 1, wherein the second-tab bend axis is substantially perpendicular to the second elongate direction, to be bendable to engage the interior surface of the side wall of the second electrical box.

3. The mounting bracket of claim 1, wherein the first-tab bend axis is parallel to the first elongate direction, to be bendable to engage the exterior surface of the side wall of the first electrical box.

4. The mounting bracket of claim 1, wherein each keyhole feature of the second set of keyhole features has an engaging portion that is sized to receive a corresponding one of the second fasteners, in a second fastener insertion direction, to secure the second electrical box to the mounting bracket, the second fastener insertion direction corresponding to movement of the second fasteners toward the second side of the mounting body.

5. The mounting bracket of claim 1, wherein each keyhole feature of the first set of keyhole features has an engaging portion that is sized to receive a corresponding one of the first fasteners, in a first fastener insertion direction, to secure the first electrical box to the mounting bracket, the first fastener insertion direction corresponding to movement of the first fasteners toward the second side of the mounting body.

6. The mounting bracket of claim 1, wherein at least one of the first bendable tab or the second bendable tab is positioned offset from a center of the first or second side of the mounting body, respectively.

7. The mounting bracket of claim 1, wherein the first elongate direction is substantially parallel to the second elongate direction.

8. The mounting bracket of either of claim 1, wherein both of the first bendable tab and the second bendable tab define part of the edge of the central opening.

9. The mounting bracket of claim 1, wherein the first bendable tab includes a tapered engagement surface that is configured to progressively engage the exterior surface of the side wall of the first electrical box as the first bendable tab is bent rearward away from the front face of the mounting body.

10. The mounting bracket of claim 1, wherein the plurality of keyhole features includes a third set of keyhole features oriented to selectively receive third fasteners along a third elongate direction to secure a third electrical box to the mounting bracket that has a different size than the first and second electrical boxes; and
    wherein the mounting body includes a third bendable tab located adjacent the second side of the central opening on the second side of the mounting body, the third bendable tab being bendable rearward away from the front face of the mounting body to engage an interior surface of a side wall of the third electrical box and thereby secure the third fasteners within the third set of keyhole features.

11. The mounting bracket of claim 10, wherein the third bendable tab is bendable about a third-tab bend axis that is substantially perpendicular to the third elongate direction to engage the interior surface of the side wall of the third electrical box; and
    wherein
        the first-tab bend axis is substantially perpendicular to the third-tab bend axis.

12. The mounting bracket of claim 1, wherein the plurality of keyhole features includes a third set of keyhole features oriented to selectively receive third fasteners along a third elongate direction perpendicular to the first and second elongate directions of the first and second sets of keyhole features, the third set of keyhole features configured to secure a third electrical box to the mounting bracket that has a different size than the first and second electrical boxes; and
    wherein the mounting body includes a third bendable tab located adjacent a third side of the central opening on a third side of the mounting body, the third side extending between and perpendicular to the first and second sides, the third bendable tab being bendable rearward away from the front face of the mounting body to engage an interior side wall of the third electrical box and thereby secure the third fasteners within the third set of keyhole features.

13. The mounting bracket of claim 12, wherein the third bendable tab is bendable about a third-tab bend axis—that is substantially perpendicular to the third elongate direction of the third set of keyhole features; and
    wherein
        the first-tab bend axis is substantially parallel to the third-tab bend axis.

14. A mounting bracket and electrical box assembly, the assembly comprising:
an electrical box selected from a set of electrical boxes including a first electrical box with a first width, a second electrical box with a second width different from the first width; and
a mounting bracket with a mounting body that is secured to the electrical box, the mounting body comprising:
a first set of keyhole features arranged around a central opening of the mounting body and configured to slidably receive first fasteners to attach the first electrical box to the mounting bracket in a first sliding direction;
a second set of keyhole features arranged around the central opening of the mounting body and configured to slidably receive second fasteners to attach the second electrical box to the mounting bracket in a second sliding direction; and
a first bendable tab located on a first side of the mounting body and a second bendable tab located on a second side of the mounting body opposite the first side, the first and second bendable tabs being bendable relative to a front face of the mounting body at, respectively, a first pre-formed bend feature that defines a first bend axis and a second pre-formed bend feature that defines a second bend axis transverse to the first bend axis, and at least one of the first bendable tab or the second bendable tab defining part of an edge of the central opening;
the first bendable tab, if the electrical box is the first electrical box, being bent rearward away from the front face to extend over, and engage with, an exterior side of a side wall of the first electrical box, to prevent movement of the first electrical box opposite the first sliding direction and thereby secure the first fasteners within the first set of keyhole features; and
the second bendable tab, if the electrical box is the second electrical box, being bent rearward away from the front face to extend over, and engage with, an interior side of a side wall of the second electrical box, to prevent movement of the second electrical box opposite the second sliding direction and thereby secure the second fasteners within the second set of keyhole features.

15. The mounting bracket of claim 14, wherein the set of electrical boxes further includes a third electrical box with a third width different from the first and second widths; and
wherein the mounting body further comprises:
a third set of keyhole features arranged around the central opening of the mounting body and configured to slidably receive third fasteners to attach the third electrical box to the mounting bracket in a third sliding direction; and
a third bendable tab located on the second side of the mounting body, being bendable relative to the front face of the mounting body, the third bendable tab, if the electrical box is the third electrical box, being bent rearward away from the front face to extend over, and engage with, an interior side of a sidewall of the third electrical box, to prevent movement of the third electrical box opposite the third sliding direction and thereby secure the third fasteners within the third set of keyhole features.

16. The mounting bracket of claim 15, wherein the first bendable tab is bendable about a first bend axis, the second bendable tab is bendable about a second bend axis, and the third bendable tab is bendable about a third bend axis; and
wherein the first bend axis is parallel to the first sliding direction, the second bend axis is perpendicular to the second sliding direction, and the third bend axis is perpendicular to the third sliding direction.

17. The mounting bracket of claim 14, wherein the set of electrical boxes further includes a third electrical box with a third width different from the first and second widths; and
wherein the mounting body further comprises:
a third set of keyhole features arranged around the central opening of the mounting body and configured to slidably receive third fasteners to attach the third electrical box to the mounting bracket in a third sliding direction; and
a third bendable tab located on a third side of the mounting body, being bendable relative to the front face of the mounting body, the third bendable tab, if the electrical box is the third electrical box, being bent rearward away from the front face to extend over, and engage with, an interior side of a sidewall of the third electrical box, to prevent movement of the third electrical box opposite the third sliding direction and thereby secure the third fasteners within the third set of keyhole features; and
wherein the third sliding direction is perpendicular to the first and second sliding directions.

18. A method of installing an electrical box on a mounting bracket, the method comprising:
inserting a plurality of fasteners that are engaged with the electrical box into a plurality of keyhole features in a mounting body of the mounting bracket;
translating the fasteners into engaging portions of the plurality of keyhole features to secure the electrical box to the mounting body; and
after translating the fasteners into the engaging portions, selectively bending, based on a size of the electrical box:
a first bendable tab that defines part of a first edge of a central opening of the mounting body, the first bendable tab being bent rearwardly relative to a front face of the mounting body about a first-tab bend axis, to engage an exterior surface of the electrical box to secure the fasteners within the engaging portions of the plurality of keyhole features, or
a second bendable tab that defines part of a second edge of the central opening of the mounting body, the second bendable tab being bent rearwardly relative to the front face of the mounting body about a second-tab bend axis that extends perpendicular to the first-tab bend axis, to engage an interior surface of the electrical box to secure the fasteners within the engaging portions of the plurality of keyhole features.

19. The method of claim 18, wherein the method includes bending the second bendable tab to engage the interior surface of the electrical box; and
wherein translating the fasteners into the engaging portions of the plurality of keyhole features translates the fasteners in a direction toward a side of the mounting body on which the second bendable tab is located.

20. The method of claim 18, wherein the method includes bending the first bendable tab to engage the exterior surface of the electrical box; and
wherein translating the fasteners into the engaging portions of the plurality of keyhole features includes translating the fasteners into the engaging portions of the plurality of keyhole features in a direction away from a side of the mounting body on which the first bendable tab is located.

\* \* \* \* \*